(12) United States Patent
Sung et al.

(10) Patent No.: US 12,501,783 B2
(45) Date of Patent: Dec. 16, 2025

(54) DISPLAY DEVICE AND MANUFACTURING METHOD FOR THE SAME

(71) Applicant: Samsung Display Co., Ltd., Yongin-si (KR)

(72) Inventors: Woo Yong Sung, Seoul (KR);
Seungyong Song, Suwon-si (KR);
Kwanhyuck Yoon, Seoul (KR);
Jeongseok Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 581 days.

(21) Appl. No.: 17/968,146

(22) Filed: Oct. 18, 2022

(65) Prior Publication Data

US 2023/0180530 A1 Jun. 8, 2023

(30) Foreign Application Priority Data

Dec. 3, 2021 (KR) ........................ 10-2021-0172409

(51) Int. Cl.
*H10K 59/122* (2023.01)
*H10K 50/844* (2023.01)
*H10K 59/12* (2023.01)
*H10K 71/00* (2023.01)
*H10K 102/10* (2023.01)

(52) U.S. Cl.
CPC ......... *H10K 59/122* (2023.02); *H10K 50/844* (2023.02); *H10K 71/00* (2023.02); *H10K 59/1201* (2023.02); *H10K 2102/101* (2023.02)

(58) Field of Classification Search
CPC .. H10K 59/122; H10K 59/1201; H10K 71/00; H10K 50/844; H10K 2102/101

USPC .............................................. 257/40, 59, 99
See application file for complete search history.

(56) References Cited

U.S. PATENT DOCUMENTS

| | | | |
|---|---|---|---|
| 6,870,197 B2 | 3/2005 | Park et al. | |
| 9,735,212 B2 | 8/2017 | Pang | |
| 10,090,484 B1 | 10/2018 | Kwon et al. | |
| 10,811,478 B2 | 10/2020 | Choi et al. | |

(Continued)

FOREIGN PATENT DOCUMENTS

| | | |
|---|---|---|
| KR | 100474001 B1 | 3/2005 |
| KR | 100512900 B1 | 9/2005 |

(Continued)

*Primary Examiner* — Eric W Jones
(74) *Attorney, Agent, or Firm* — CANTOR COLBURN LLP

(57) ABSTRACT

A display device includes a base layer, a circuit layer disposed on the base layer, a pixel definition layer disposed on the circuit layer, including an inorganic protective layer and an organic layer disposed on the inorganic protective layer, and defining a first opening adjacent to the circuit layer and exposing the inorganic protective layer and a second opening exposing the organic layer on the first opening, a light-emitting element including a first electrode disposed on the circuit layer, a functional layer disposed on the first electrode, and a second electrode disposed on the functional layer, and an encapsulation layer covering the pixel definition layer and the light-emitting element. The encapsulation layer includes an auxiliary electrode layer covering the light-emitting element, the inorganic protective layer, and the organic layer, an encapsulation organic film disposed on the auxiliary electrode layer, and an upper inorganic film disposed on the encapsulation organic film.

35 Claims, 13 Drawing Sheets

(56) References Cited

U.S. PATENT DOCUMENTS

| | | | |
|---|---|---|---|
| 11,205,685 B2 | 12/2021 | Han et al. | |
| 2021/0183979 A1 | 6/2021 | Lee et al. | |

FOREIGN PATENT DOCUMENTS

| | | | |
|---|---|---|---|
| KR | 1020150141338 A | 12/2015 | |
| KR | 1020170035698 A | 3/2017 | |
| KR | 1020180104227 A | 9/2018 | |
| KR | 102076620 B1 | 2/2020 | |
| KR | 1020200014463 A | 2/2020 | |
| KR | 1020200073805 A | 6/2020 | |
| KR | 102248402 B1 | 5/2021 | |

DISPLAY DEVICE AND MANUFACTURING METHOD FOR THE SAME

This application claims priority to Korean Patent Application No. 10-2021-0172409, filed on Dec. 3, 2021, and all the benefits accruing therefrom under 35 U.S.C. § 119, the content of which in its entirety is herein incorporated by reference.

BACKGROUND

1. Field

Embodiments of the invention herein relate to a display device and a method for manufacturing the display device, and more particularly, to a display device with improved reliability by protecting a light-emitting element with an encapsulation layer, and a method for manufacturing the display device.

2. Description of the Related Art

A display device may be manufactured by including an organic electroluminescence material, a quantum dot light-emitting material, or the like. Such a light-emitting material is characterized by being vulnerable to external environments, such as oxygen and moisture, and thus, desires a functional layer to protect the light-emitting material.

While forming such functional layers, or during a manufacturing process of a display device such as providing and bonding members of the display device, foreign substances may be introduced to the inside of the display device, and cracks caused by the introduced foreign substances may expose the light-emitting material or the like to the external environment. Accordingly, various techniques for sealing a light-emitting element are desired. Among these, an encapsulation layer, which is disposed on a light-emitting element to block the penetration path of air, moisture, and the like, is being developed.

SUMMARY

Embodiments of the invention provide a display device with improved reliability by including an auxiliary electrode layer which directly covers a light-emitting element.

Embodiments of the invention also provide a method for manufacturing a display device including a method for forming an auxiliary electrode layer which effectively covers a light-emitting element disposed in an opening.

An embodiment of the invention provides a display device including a base layer, a circuit layer disposed on the base layer, a pixel definition layer which is disposed on the circuit layer and includes an inorganic protective layer and an organic layer disposed on the inorganic protective layer, and in which a first opening adjacent to the circuit layer and exposing the inorganic protective layer and a second opening exposing the organic layer on the first opening are defined, a light-emitting element including a first electrode disposed on the circuit layer, a functional layer disposed on the first electrode, and a second electrode disposed on the functional layer, and an encapsulation layer disposed on the light-emitting element. The encapsulation layer includes an auxiliary electrode layer which covers the light-emitting element disposed in the first opening, the inorganic protective layer exposed by the first opening, and the organic layer disposed on the inorganic protective layer, an encapsulation organic film disposed on the auxiliary electrode layer, and an upper inorganic film disposed on the encapsulation organic film.

In an embodiment, the auxiliary electrode layer may include a transparent metal oxide.

In an embodiment, the auxiliary electrode layer may be formed by atomic layer deposition using an indium precursor.

In an embodiment, in a cross-section perpendicular to the base layer, a width of the first may be greater than a width of the second opening adjacent to the first opening.

In an embodiment, the functional layer may include a first sub-functional layer disposed on the first electrode and disposed in the first opening, and a second sub-functional layer disconnected from the first sub-functional layer and disposed on a side surface of the pixel definition layer defining the second opening and on an upper surface of the pixel definition layer, and the second electrode may include a first sub-electrode part disposed on the first sub-functional layer, and a second sub-electrode part short-circuited with the first sub-electrode part and disposed on the second sub-functional layer.

In an embodiment, the auxiliary electrode layer may be disposed on the first sub-electrode part and the second sub-electrode part, and may electrically connect the first sub-electrode part and the second sub-electrode part.

In an embodiment, the inorganic protective layer may be exposed in a short-circuited portion in which the first sub-functional layer and the second sub-functional layer are disconnected and the first sub-electrode part and the second sub-electrode part are short-circuited, and the auxiliary electrode layer may cover the first sub-electrode part, the second sub-electrode part, and the inorganic protective layer exposed in the short-circuited portion.

In an embodiment, the first sub-functional layer may include a hole transport region, a light-emitting layer, and an electron transport region sequentially laminated, and the second sub-functional layer may include the hole transport region and the electron transport region, and may not include the light-emitting layer.

In an embodiment, in the first opening, an edge of the first electrode, an edge of the first sub-functional layer, and an edge of the first sub-electrode part may overlap.

In an embodiment, the edge of the first electrode, the edge of the first sub-functional layer, and the edge of the first sub-electrode part may contact the inorganic protective layer exposed in the first opening.

In an embodiment, the encapsulation layer may further include a lower inorganic film disposed between the auxiliary electrode layer and the encapsulation organic film, and including at least one of silicon nitride, silicon oxynitride, and silicon oxide.

In an embodiment, the lower inorganic film may cover the auxiliary electrode layer.

In an embodiment, the encapsulation layer may further include a filling electrode layer disposed between the auxiliary electrode layer and the encapsulation organic film, and the filling electrode layer includes a conductive polymer, and a lower inorganic film disposed between the filling electrode layer and the encapsulation organic film, and the lower inorganic film includes at least one of silicon nitride, silicon oxynitride, and silicon oxide.

In an embodiment, the filling electrode layer may include PEDOT:PSS.

In an embodiment, the filling electrode layer may fill the first opening and a portion of the second opening.

In an embodiment, the inorganic protective layer may include silicon nitride.

In an embodiment, the upper inorganic film may include at least one of silicon nitride, silicon oxynitride, and silicon oxide.

In an embodiment, the encapsulation organic film may include an acrylic polymer, and the encapsulation organic film may fill the first opening and the second opening between the auxiliary electrode layer and the upper inorganic film.

In an embodiment, the encapsulation organic film may be a filling electrode layer including a conductive polymer, and may be electrically connected to the auxiliary electrode layer.

In an embodiment, the filling electrode layer may fill the first opening and the second opening between the auxiliary electrode layer and the upper inorganic film.

In an embodiment, in a cross-section perpendicular to the base layer, a first interval from an upper surface of the first electrode exposed in the first opening to a lower surface of the inorganic protective layer may be greater than or equal to a second interval between a side edge of the inorganic protective layer exposed in the first opening and a side edge of the inorganic protective layer exposed in the second opening.

In an embodiment, a ratio of the first interval and the second interval may be 1:1 to 2:1.

In an embodiment of the invention, a display device includes a base layer, a circuit layer disposed on the base layer, a pixel definition layer which is disposed on the circuit layer and includes an inorganic protective layer and an organic layer disposed on the inorganic protective layer, and in which an opening is defined, a light-emitting element including a first electrode disposed on the circuit layer, a functional layer disposed on the first electrode, and a second electrode disposed on the functional layer, and an encapsulation layer disposed on the light-emitting element. The pixel definition layer includes a first portion directly disposed on the circuit layer, a second portion which is spaced apart in a thickness direction in the circuit layer and disposed on one side of the first portion, and in which an upper opening exposing the inorganic protective layer and the organic layer is defined, and a third portion disposed between the first portion and the second portion, and having a lower opening exposing the inorganic protective layer, where the encapsulation layer includes an auxiliary electrode layer which covers the light-emitting element disposed in the lower opening, the inorganic protective layer exposed in the lower opening, and the light-emitting element disposed in the upper opening, an encapsulation organic film disposed on the auxiliary electrode layer, and an upper inorganic film disposed on the encapsulation organic film.

In an embodiment, the pixel definition layer may be defined by the second portion and the third portion, and may include a notch portion recessed in the first portion direction.

In an embodiment, the functional layer may include a first sub-functional layer disposed in the lower opening, and a second sub-functional layer disconnected from the first sub-functional layer and disposed on a side surface of the pixel definition layer defining the upper opening and on an upper surface of the pixel definition layer, and the second electrode may include a first sub-electrode part disposed on the first sub-functional layer, and a second sub-electrode part short-circuited with the first sub-electrode part and disposed on the second sub-functional layer.

In an embodiment, an edge of the first electrode, an edge of the first sub-functional layer, and an edge of the first sub-electrode part may be disposed in the notch portion.

In an embodiment, the inorganic protective layer may be exposed in a short-circuited portion in which the first sub-functional layer and the second sub-functional layer are disconnected and the first sub-electrode part and the second sub-electrode part are short-circuited, and the auxiliary electrode layer may cover the first sub-electrode part, the second sub-electrode part, and the inorganic protective layer exposed in the short-circuited portion.

In an embodiment of the invention, a method for manufacturing a display device includes patterning a first electrode and a sacrificial layer on a circuit layer, providing a preliminary inorganic protective layer on a patterned sacrificial layer, forming an organic layer in which an upper opening exposing a portion of an upper surface of the preliminary inorganic protective layer overlapping the patterned sacrificial layer is defined, forming a pixel definition layer including an inorganic protective layer and the organic layer disposed on the inorganic protective layer by patterning the preliminary inorganic protective layer, and exposing the patterned sacrificial layer overlapping the first electrode is exposed, defining a lower opening exposing an upper surface of the first electrode and the inorganic protective layer by etching an exposed portion of the patterned sacrificial layer, providing a functional layer on the first electrode and the pixel definition layer, providing a second electrode on the functional layer, and forming an auxiliary electrode layer to cover the second electrode and the inorganic protective layer exposed in the lower opening.

In an embodiment, the forming the auxiliary electrode layer may include forming the auxiliary electrode layer including a transparent metal oxide by atomic layer deposition.

In an embodiment, the providing the preliminary inorganic protective layer may include forming the preliminary inorganic protective layer including silicon nitride by atomic layer deposition.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
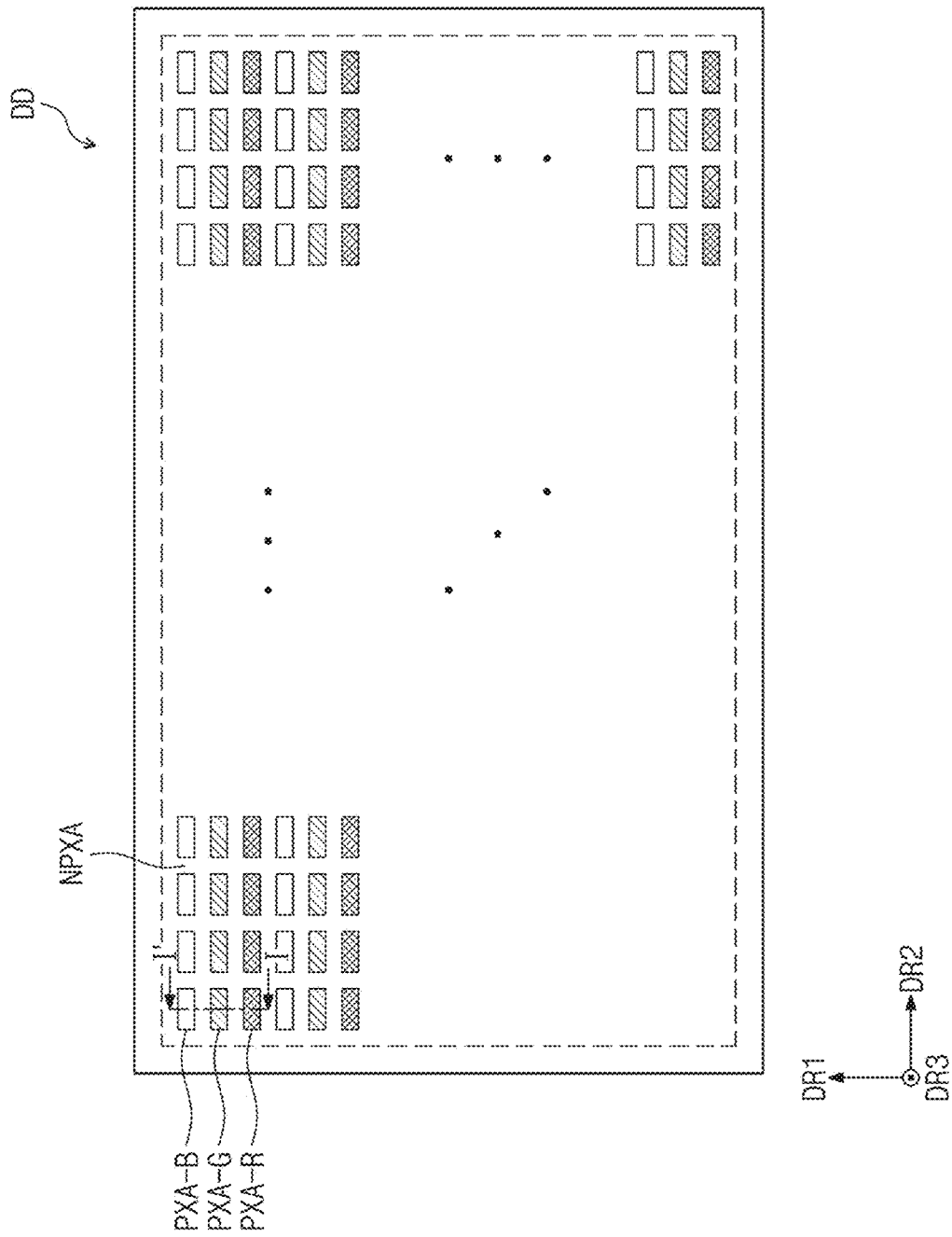
FIG. 1 is a plan view of an embodiment of a display device according to the invention.

Embodiments of the invention may be modified in many alternate forms, and thus embodiments will be exemplified in the drawings and described in detail. It should be understood, however, that it is not intended to limit the invention to the particular forms disclosed, but rather, is intended to cover all modifications, equivalents, and alternatives falling within the spirit and scope of the invention.

In the disclosure, when an element (or a region, a layer, a portion, and the like) is referred to as being "on," "connected to," or "coupled to" another element, it means that the element may be directly disposed on/connected to/coupled to the other element, or that a third element may be disposed therebetween.

In the disclosure, being "directly disposed" may mean that there is no layer, film, region, plate, or the like added between a portion of a layer, a film, a region, a plate, or the like and other portions. Being "directly disposed" may mean being disposed without additional members such as an adhesive member between two layers or two members, for example.

Like reference numerals refer to like elements. Also, in the drawings, the thickness, the ratio, and the dimensions of elements are exaggerated for an effective description of technical contents. The term "and/or," includes all combinations of one or more of which associated components may define.

It will be understood that, although the terms "first," "second," etc. may be used herein to describe various elements, these elements should not be limited by these terms. These terms are only used to distinguish one element from another. A first element may be referred to as a second element, and a second element may also be referred to as a first element in a similar manner, for example, without departing the scope of rights of the invention. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings. In the disclosure, being "disposed on" may not only include the case of being disposed on an upper portion of any one member but also the case of being disposed on a lower portion thereof.

It should be understood that the terms "comprise," or "have" are intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, a display device in an embodiment of the invention will be described with reference to the accompanying drawings.

FIG. 1 is a plan view showing an embodiment of a display device DD. Referring to FIG. 1, the display device DD of an embodiment may include a plurality of light-emitting regions PXA-R, PXA-G, and PXA-B. In an embodiment, the display device DD of an embodiment may include a first light-emitting region PXA-R, a second light-emitting region PXA-G, and a third light-emitting region PXA-B separated from each other. In an embodiment, the first light-emitting region PXA-R may be a red light-emitting region which emits red light, the second light-emitting region PXA-G may be a green light-emitting region which emits green light, and the third light-emitting region PXA-B may be a blue light-emitting region which emits blue light.

In a plan view defined by a first direction axis DR1 and a second direction axis DR2, the first to third light-emitting regions PXA-R, PXA-G, and PXA-B may be separated without overlapping each other. In an embodiment, between adjacent light-emitting regions PXA-R, PXA-G, and PXA-B, a non-light-emitting region NPXA may be disposed, for example.

In FIG. 1 and the following drawings, a first direction axis DR1 to a third direction axis DR3 are illustrated. Directions indicated by the first to third direction axes DR1, DR2, and DR3 described in the disclosure are relative concepts, and may be converted to different directions. In addition, the directions indicated by the first to third direction axes DR1, DR2, and DR3 may be described as first to third directions, and may be denoted by the same reference numerals.

In the disclosure, the first direction axis DR1 and the second direction axis DR2 are perpendicular to each other, and the third direction axis DR3 may be a normal direction with respect to a plane defined by the first direction axis DR1 and the second direction axis DR2.

The thickness direction of the display device DD may be a direction parallel to a third direction axis DR3, which is a normal direction with respect to a plane defined by the first direction axis DR1 and the second direction axis DR2. In the disclosure, a front surface (or an upper surface) and a rear surface (or a lower surface) of members constituting the display device DD may be defined on the basis of the third direction axis DR3.

FIG. 1 illustrates that the light-emitting regions PXA-R, PXA-G, and PXA-B are arranged in a stripe form in the display device DD in an embodiment. That is, in the display device DD of an embodiment illustrated in FIG. 1, each of a plurality of first light-emitting regions PXA-R, a plurality of second light-emitting regions PXA-G, and a plurality of third light-emitting regions PXA-B may be aligned along the second direction axis DR2. In addition, the first light-emitting region PXA-R, the second light-emitting region PXA-G, and the third light-emitting region PXA-B may be alternately arranged in the same order along the first direction axis DR1.

The arrangement form of the light-emitting regions PXA-R, PXA-G, and PXA-B is not limited to what is illustrated in FIG. 1. The order in which the first light-emitting region PXA-R, the second light-emitting region PXA-G, and the third light-emitting region PXA-B are arranged may be provided in various combinations depending on the characteristics of display quality desired by the display device DD. In an embodiment, the arrangement form of the light-emitting regions PXA-R, PXA-G, and PXA-B may be a PENTILE® arrangement form, or a diamond arrangement form, for example.

In an embodiment, among the plurality of light-emitting regions PXA-R, PXA-G, and PXA-B, light-emitting regions PXA-R, PXA-G, and PXA-B which emit light of different wavelength regions from each other may have different areas from each other. At this time, the area may mean the area in a plan view defined by the first direction axis DR1 and the second direction axis DR2. However, the invention is not limited thereto. The light-emitting regions PXA-R, PXA-G, and PXA-B may have the same area as each other. In addition, depending on the characteristics of display quality desired by the display device DD, the area ratio may be variously adjusted, and the shapes of the light-emitting regions PXA-R, PXA-G, and PXA-B in a plan view may be variously changed and provided.

FIG. 1 illustrates that each of the light-emitting regions PXA-R, PXA-G, and PXA-B has a quadrangular shape in a plan view, but the invention is not limited thereto. In an embodiment, each of the light-emitting regions PXA-R, PXA-G, and PXA-B may have a polygonal, circular, or the like shape in a plan view.

Figure 2:
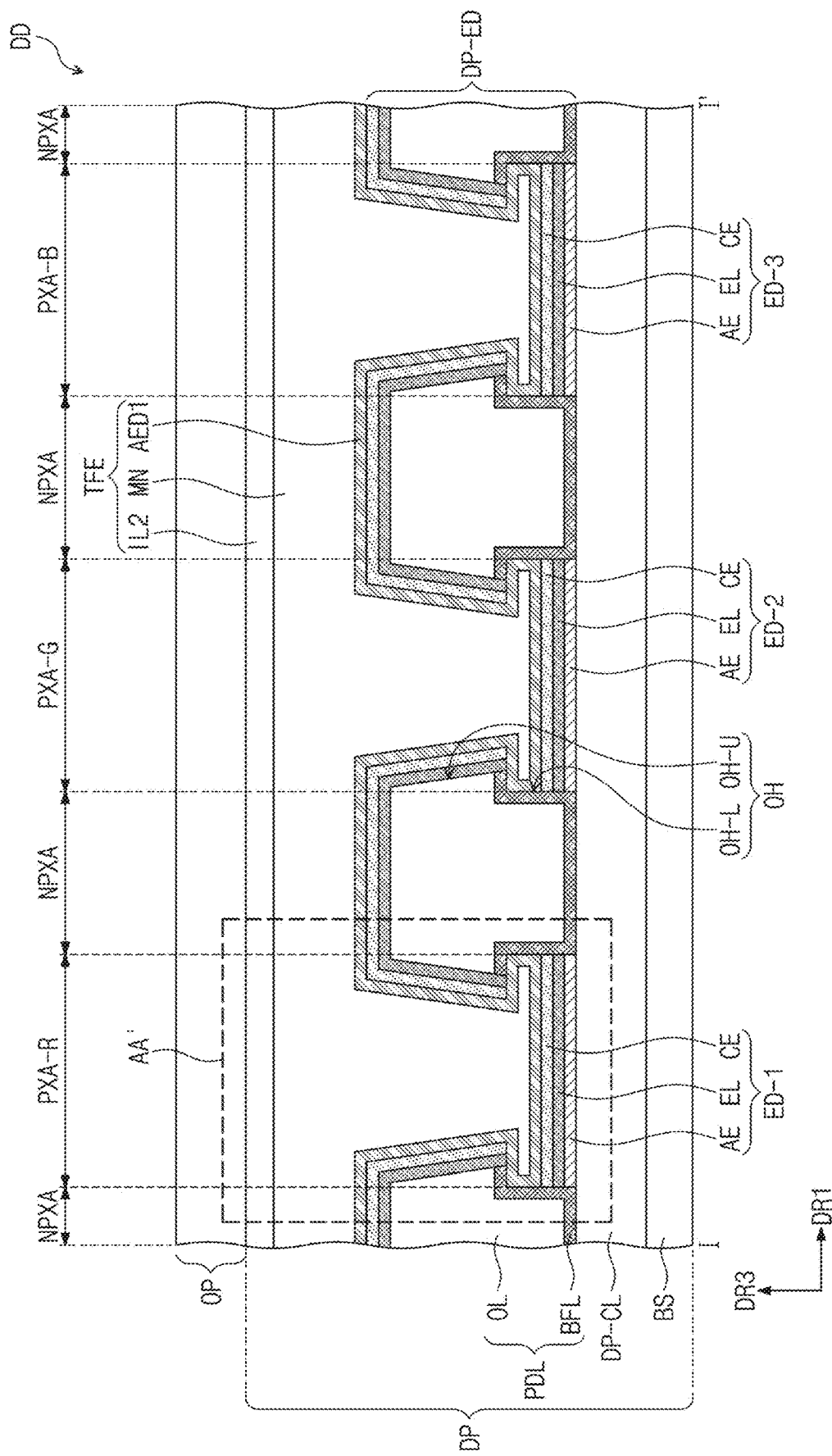
FIG. 2 is a cross-sectional view of an embodiment of a display device according to the invention.
Figure 3:
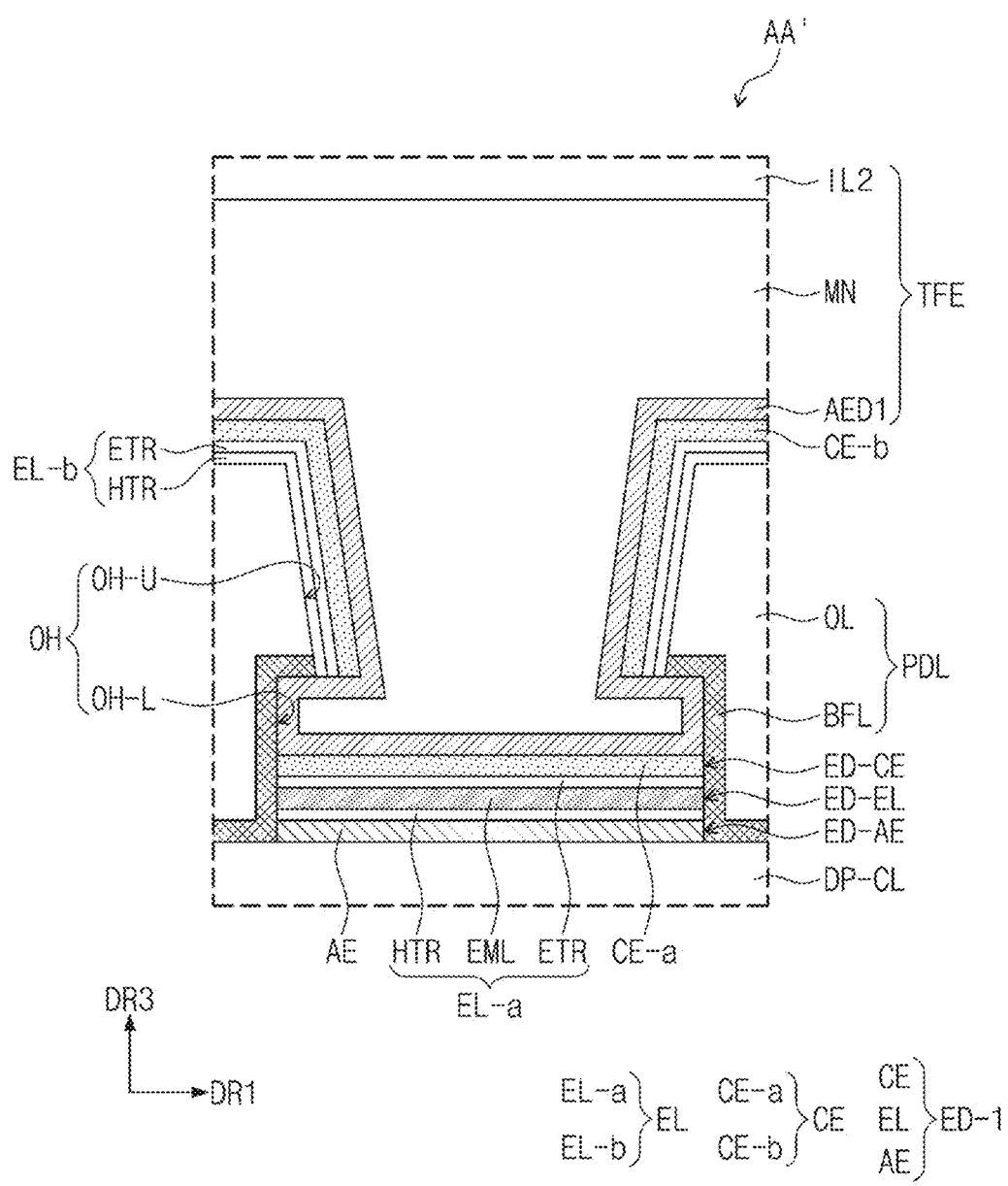
FIG. 3 is a cross-sectional view of an embodiment of a portion of a display device according to the invention.

FIG. 2 is a cross-sectional view of the display device DD of an embodiment. FIG. 2 is a cross-sectional view showing a portion corresponding to line I-I' of FIG. 1. FIG. 3 is a cross-sectional view showing a portion of a display device. FIG. 3 is a cross-sectional view showing region AA' of FIG. 2.

Referring FIG. 2, the display device DD of an embodiment may include a display panel DP and an optical layer OP disposed on the display panel DP. The display panel DP includes light-emitting elements ED-1, ED-2, and ED-3. The display device DD may include the plurality of light-emitting elements ED-1, ED-2, and ED-3 divided by a pixel definition layer PDL to correspond to the first to third light-emitting regions PXA-R, PXA-G, and PXA-B.

The optical layer OP may be disposed on the display panel DP to control reflective light in the display panel DP caused by external light. In an embodiment, the optical layer OP may include a polarizing layer or a color filter layer, for example. The optical layer OP may be also referred to as a light control panel or a light control substrate. Unlike what is illustrated in the drawings, the optical layer OP may be omitted in the display device DD of an embodiment.

Although not illustrated, the display device DD of an embodiment may further include an input sensor (now shown). In an embodiment, the input sensor (now shown) may be disposed between the display panel DP and the optical layer OP, for example. Specifically, the input sensor (now shown) may be directly disposed on a thin film encapsulation layer TFE to be described later.

In the display device DD in an embodiment, the display panel DP may include a base layer BS, a circuit layer DP-CL disposed on the base layer BS, a display element layer DP-ED disposed on the circuit layer DP-CL, and the thin film encapsulation layer TFE disposed on the display element layer DP-ED. The display element layer DP-ED may include a pixel definition layer PDL, and the light-emitting elements ED-1, ED-2, and ED-3 separated by the pixel definition layer PDL.

In the display device DD in an embodiment, the display panel DP may be a light emission type display panel. In an embodiment, the display panel DP may be an organic electroluminescence display panel, for example. When the display panel DP is an organic electroluminescence display panel, the display element layer DP-ED may include an organic electroluminescence element.

However, the invention is not limited thereto. In an embodiment, the display element layer DP-ED may include quantum dot light-emitting diodes as the light-emitting elements ED-1, ED-2, and ED-3, for example. In addition, the display element layer DP-ED may include micro-LED elements and/or nano-LED elements as the light-emitting elements ED-1, ED-2, and ED-3.

In the display panel DP, the base layer BS may be a member which provides a base surface on which the display element layer DP-ED is disposed. In an embodiment, the base layer BS may be a glass substrate, a metal substrate, a polymer substrate, or the like. However, the invention is not limited thereto. The base layer BS may be an inorganic layer, a functional layer, or a composite material layer.

The base layer BS may have a multi-layered structure. In an embodiment, the base layer BS may have a three-layered structure of a polymer resin layer, an adhesive layer, and a polymer resin layer, for example. Particularly, the polymer resin layer may include a polyimide-based resin. In addition, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, an expression such as "X-based" resin means that a functional group of "X" is included.

In an embodiment, the circuit layer DP-CL is disposed on the base layer BS, and the circuit layer DP-CL may include a plurality of transistors (not shown). Each of the transistors (not shown) may include a control electrode, an input electrode, and an output electrode. In an embodiment, the circuit layer DP-CL may include a switching transistor and a driving transistor for driving the light-emitting elements ED-1, ED-2, and ED-3 of the display element layer DP-ED, for example.

In an embodiment, the circuit layer DP-CL may include an insulation layer, a semiconductor pattern, a conductive pattern, a signal line, or the like. In an embodiment, the insulation layer, a semiconductor layer, and a conductive layer are formed above the base layer BS by coating, deposition, or the like, and thereafter, the insulation layer, the semiconductor layer, and the conductive layer may be selectively patterned through performing a photolithography process a plurality of times. Thereafter, the semiconductor pattern, the conductive pattern, and the signal line included in the circuit layer DP-CL may be formed. In an embodiment, the circuit layer DP-CL may include a transistor, a buffer layer, and a plurality of insulation layers.

On the circuit layer DP-CL, the display element layer DP-ED including the light-emitting elements ED-1, ED-2, and ED-3 is disposed. The display element layer DP-ED may include the pixel definition layer PDL in which an opening OH is defined, and the plurality of light-emitting elements ED-1, ED-2, and ED-3 separated by the pixel definition layer PDL.

Each of the light-emitting elements ED-1, ED-2, and ED-3 may include a first electrode AE, a functional layer EL, and a second electrode CE. Referring to FIG. 3, the functional layer EL may include a hole transport region HTR, a light-emitting layer EML, and an electron transport region ETR. Although not illustrated, the light-emitting elements ED-1, ED-2, and ED-3 may further include a capping layer (now shown) disposed on an upper portion of the second electrode CE.

FIG. 3 illustrates a first light-emitting element ED-1 corresponding to a first light-emitting region PXA-R, but the laminate structure of the first light-emitting element ED-1 may be applied to a second light-emitting element ED-2 and to a third light-emitting element ED-3. However, the configurations of the functional layer EL of the first to third light-emitting elements ED-1, ED-2, and ED-3 may be different from each other. In an embodiment, the first to third light-emitting elements ED-1, ED-2, and ED-3 may have different configurations of the light-emitting layer EML, for example.

The light-emitting layer EML of each of the light-emitting elements ED-1, ED-2, and ED-3 formed separated to respectively correspond to the light-emitting regions PXA-R, PXA-G, and PXA-B may all emit blue light, or may emit light of different wavelength regions. In an embodiment, the light-emitting layer of the first light-emitting element ED-1 may emit red light, the light-emitting layer of the second light-emitting element ED-2 may emit green light, and the light-emitting layer of the third light-emitting element ED-3 may emit blue light, for example. However, the invention is not limited thereto, and the wavelength of light emitted from each of the first to third light-emitting elements ED-1, ED-2, and ED-3 may be variously combined depending on the display quality desired by a display device.

Hereinafter, a description will be given with reference to the first light-emitting element ED-1 illustrated in FIG. 3 or the like, and the description of the first light-emitting element ED-1 may be equally applied to the second and third light-emitting elements ED-2 and ED-3, except for the configuration of a light-emitting layer.

In the light-emitting element ED-1, the first electrode AE may be an anode or a cathode. In addition, the first electrode AE may be a pixel electrode. The first electrode AE may be a transmissive electrode, a transflective electrode, or a reflective electrode. In an embodiment, when the first electrode AE is a transmissive electrode, the first electrode AE may include a transparent metal oxide, e.g., indium tin oxide ("ITO"), indium zinc oxide ("IZO"), zinc oxide (ZnO), indium tin zinc oxide ("ITZO"), or the like. When the first electrode AE is a transflective electrode or a reflective electrode, the first electrode AE may include Ag, Mg, Cu, Al, Pt, Pd, Au, Ni, Nd, Ir, Cr, Li, Ca, LiF/Ca, LiF/Al, Mo, Ti, W, or a compound or combination thereof (e.g., a combination of Ag and Mg). In an alternative embodiment, the first electrode AE may have a multi-layered structure including a reflective film or transflective film including the above exemplified materials, and a transparent conductive film including ITO, IZO, zinc oxide (ZnO), ITZO, or the like. In an embodiment, the first electrode AE may have a three-layered structure of ITO/Ag/ITO, for example, but is not limited thereto.

The hole transport region HTR may be disposed between the first electrode AE and the light-emitting layer EML. Although not illustrated, the hole transport region HTR may include at least one of a hole injection layer, a hole transport layer, and an electron blocking layer.

In an embodiment, the hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) ("DNTPD"), 4,4',4"-[tris(3-methylphenyl)phenylamino] triphenylamine ("m-MTDATA"), 4,4'4"-Tris(N,N-diphenylamino) triphenylamine ("TDATA"), 4,4',4"-tris[N(2-naphthyl)-N-phenylamino]-triphenylamine ("2-TNATA"), Poly(3,4-ethylenedioxythiophene)/Poly(4-styrenesulfonate) ("PEDOT/PSS"), Polyaniline/Dodecylbenzenesulfonic acid ("PANI/DBSA"), Polyaniline/Camphor sulfonicacid ("PANI/CSA"), Polyaniline/Poly (4-styrenesulfonate) ("PANI/PSS"), N,N'-di(naphthalene-1-yl)-N,N'-diphenyl-benzidine ("NPB"), triphenylamine-including polyether ketone ("TPAPEK"), 4-Isopropyl-4'-methyldiphenyliodonium [Tetrakis(pentafluorophenyl)borate], dipyrazino[2,3-f: 2',3'-h] quinoxaline-2,3,6,7,10,11-hexacarbonitrile ("HATCN"), or the like.

In an embodiment, the hole transport region HTR may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine ("TPD") and 4,4',4"-tris(N-carbazolyl)triphenylamine ("TCTA"), NPB, 4,4'-Cyclohexylidene bis[N,N-bis(4-methylphenyl)benzenamine] ("TAPC"), 4,4'-Bis[N,N'-(3-tolyl) amino]-3, 3'-dimethylbiphenyl ("HMTPD"), (1,3-Bis(N-carbazolyl)benzene ("mCP"), or the like.

The light-emitting layer EML is disposed on the hole transport region HTR. The light-emitting layer EML may have a single-layered structure having a single layer including a single material, a single-layered structure having a single layer including a plurality of different materials, or a multi-layered structure having a plurality of layers including a plurality of different materials.

The light-emitting layer EML may include a fluorescent or phosphorescent light-emitting material. In a light-emitting element of an embodiment, the light-emitting layer EML may include an anthracene derivative, a pyrene derivative, a fluoranthene derivative, a chrysene derivative, a dihydrobenz anthracene derivative, or a triphenylene derivative. In addition, the light-emitting layer EML may include an organometallic complex as a light-emitting material. The light-emitting layer EML may include a quantum dot as a light-emitting material.

The electron transport region ETR may be disposed between the light-emitting layer EML and the second electrode CE. Although not illustrated, the electron transport region ETR may include at least one of an electron injection layer, an electron transport layer, and a hole blocking layer.

In an embodiment, the electron transport region ETR may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9, 10-dinaphthylanthracene, 1,3,5-tri(1-phenyl-1H-benzo[d]imidazol-2-yl)benzene (TPBi), 2,9-dimethyl-4,7-diphenyl-1,10-phenanthroline ("BCP"), 4,7-diphenyl-1,10-phenanthroline (Bphen), 3-(4-biphenylyl)-4-phenyl-5-tert-butylphenyl-1,2,4-triazole ("TAZ"), 4-(naphthalen-1-yl)-3,5-diphenyl-4H-1,2,4-triazole ("NTAZ"), 2-(4-biphenylyl)-5-(4-tert-butylphenyl)-1,3,4-oxadiazole ("tBu-PBD"), bis(2-methyl-8-quinolinolato-N1, O8)-(1, 1'-biphenyl-4-olato)aluminum (BAlq), berylliumbis (benzoquinolin-10-olate) ($Bebq_2$), 9,10-di(naphthalene-2-yl)anthracene ("ADN"), 1,3-bis[3,5-di(pyridin-3-yl)phenyl] benzene (BmPyPhB), or a combination thereof, for example.

In addition, the electron transport region ETR may include a halogenated metal such as LiF, NaCl, CsF, RbCl, RbI, CuI, and KI, a lanthanum group metal such as Yb, or a co-deposition material of the above halogenated metal and the lanthanum group metal. In an embodiment, the electron transport region ETR may include KI:Yb, RbI:Yb, or the like as the co-deposition material, for example. In an embodiment, as the electron transport region ETR, a metal oxide such as $Li_2O$ and BaO, or 8-hydroxyl-Lithium quinolate (Liq) or the like may be used, but the invention is not limited thereto. The electron transport region ETR may also consist of a combination of an electron transport material and an insulating organo metal salt.

The second electrode CE is provided on the electron transport region ETR. The second electrode CE may be a common electrode. The second electrode CE may be a cathode or an anode, but the invention is not limited thereto. In an embodiment, when the first electrode AE is an anode, the second electrode CE may be a cathode, and when the first electrode AE is a cathode, the second electrode CE may be an anode, for example.

The second electrode CE may be a transmissive electrode, a transflective electrode, or a reflective electrode. In an embodiment, when the second electrode CE is a transmissive electrode, the second electrode CE may include a transparent metal oxide, e.g., ITO, IZO, zinc oxide (ZnO), ITZO, or the like.

The pixel definition layer PDL may include an inorganic protective layer BFL and an organic layer OL. The inorganic protective layer BFL may be disposed adjacent to the circuit layer DP-CL, and the organic layer OL may be disposed on the inorganic protective layer BFL.

The inorganic protective layer BFL may define a lower surface of the pixel definition layer PDL. In a portion of the opening OH defined in the pixel definition layer PDL, the inorganic protective layer BFL may be disposed between the light-emitting element ED-1 and the organic layer OL to protect the light-emitting element ED-1. In an embodiment, the inorganic protective layer BFL may include silicon nitride, silicon oxide, silicon oxynitride, or the like. In an embodiment, the inorganic protective layer BFL may be formed by forming a film of silicon nitride and then etching the film, for example.

In an embodiment, the inorganic protective layer BFL may be formed by atomic layer deposition. The inorganic protective layer BFL may be formed by atomic layer deposition using an inorganic material such as silicon nitride.

The organic layer OL may be disposed on the inorganic protective layer BFL. The organic layer OL may include a polymer resin. In an embodiment, the organic layer OL may be formed by including a polyacrylate-based resin or a polyimide-based resin, for example. In addition, the organic layer OL may be formed by further including an inorganic matter in addition to the polymer resin. The organic layer OL may be formed by including a light absorbing material, or may be formed by including a black pigment or a black dye. The pixel definition layer PDL formed by including a black pigment or a black dye may implement a black pixel definition layer. In an embodiment, when the pixel definition layer PDL is formed, carbon black or the like may be used as a black pigment or a black dye, but the invention is not limited thereto.

In the pixel definition layer PDL, the opening OH may be defined. In the pixel definition layer PDL, a first opening OH-L adjacent to the circuit layer DP-CL and a second opening OH-U defined above the first opening OH-L may be defined. In the disclosure, the first opening OH-L may be also referred to as a lower opening, and the second opening OH-U may be also referred to as an upper opening.

In the first opening OH-L, the in organic protective layer BFL may be exposed, and in the second opening OH-U, the organic layer OL may be exposed. On a lower side of the second opening OH-U adjacent to the first opening OH-L, the inorganic protective layer BFL may be partially exposed.

In the display device DD of an embodiment, the first electrode AE, the functional layer EL, and the second electrode CE may be disposed in the first opening OH-L. The first electrode AE, the functional layer EL, and the second electrode CE disposed in the first opening OH-L may be covered and protected by the inorganic protective layer BFL and an auxiliary electrode layer AED1 to be described later.

Figure 4:
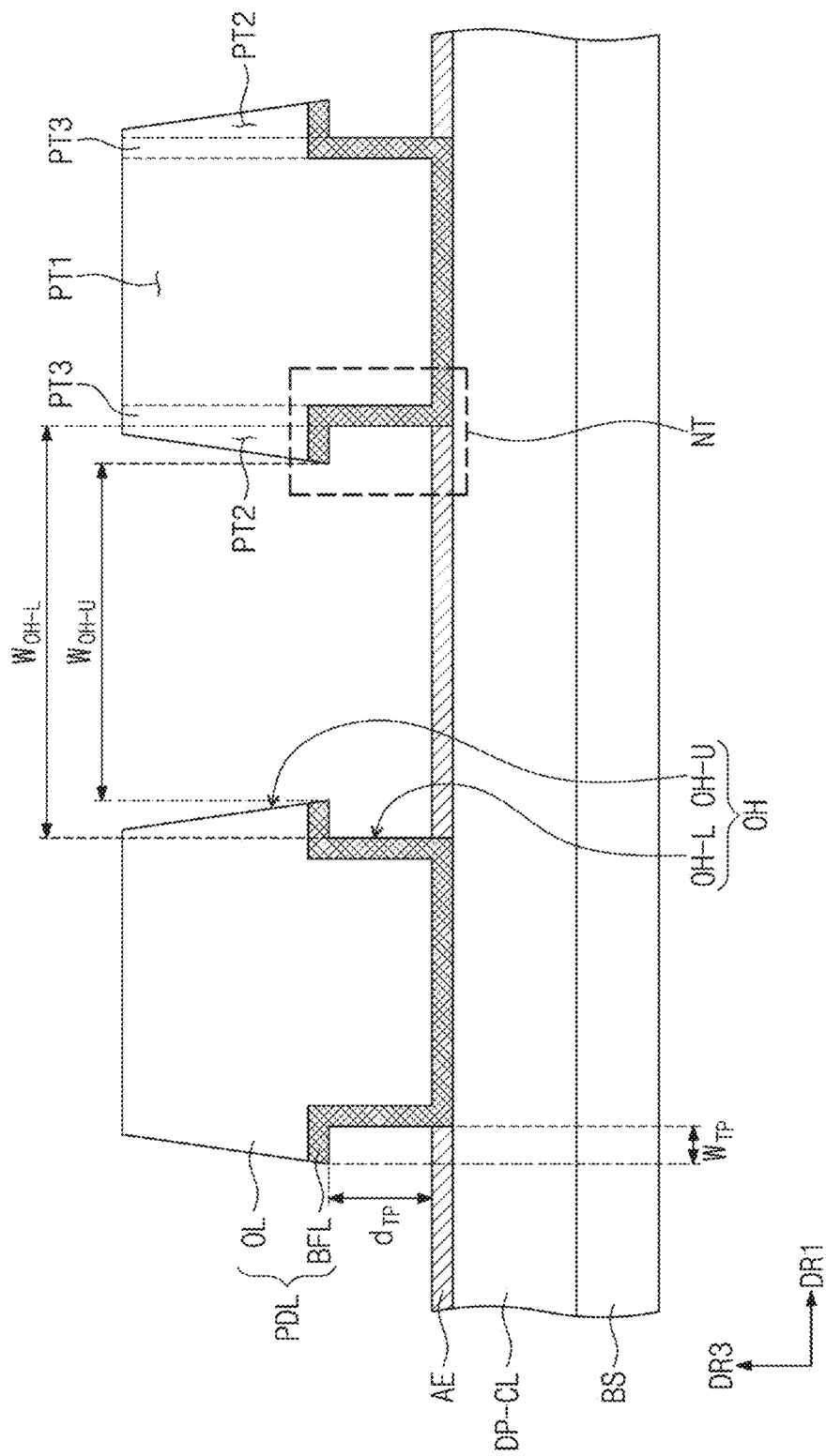
FIG. 4 is a cross-sectional view showing an embodiment of a portion of a display device according to the invention.

FIG. 4 is a cross-sectional view showing a portion of a display device. For the convenience of explanation, FIG. 4 illustrates only portions of the base layer BS, the circuit layer DP-CL disposed on the base layer BS, the pixel definition layer PDL disposed on the circuit layer DP-CL, and the first electrode AE disposed on the circuit layer DP-CL.

Referring to FIG. 4, in a plan view defined by the first direction axis DR1 and the third direction axis DR3, the pixel definition layer PDL may have a notch portion NT of an undercut shape on a lower side adjacent to the circuit layer DP-CL.

In an embodiment, in a cross-section perpendicular to the base layer BS, a width $W_{OH-L}$ of the first opening OH-L may be greater than a with $W_{OH-U}$ of the second opening OH-U adjacent to the first opening OH-L. The width $W_{OH-L}$ of the first opening OH-L may be substantially the same in the entire region of the first opening OH-L, and the width of $W_{OH-U}$ of the second opening OH-U may be gradually increased in the direction of the third direction axis DR3, which is the thickness direction. However, the invention is not limited thereto.

In an embodiment, the pixel definition layer PDL includes the notch portion NT of an undercut shape to allow edges of the first electrode AE, the functional layer EL, and the second electrode CE to be disposed in the notch portion NT, and thus, may effectively protect components of a light-emitting element in a light-emitting region using the inorganic protective layer BFL or the like.

A first interval $d_{TP}$, which is an interval in the direction of the third direction axis DR3, a thickness direction of a portion defining the notch portion NT in the pixel definition layer PDL, may be greater than or equal to a second interval $W_{TP}$, which is an interval in the direction of the first direction axis DR1, a width direction of the same. That is, in a cross-section perpendicular to the base layer BS, the first interval $d_{TP}$ from an upper surface of the first electrode AE exposed in the first opening OH-L to a lower surface of the inorganic protective layer BFL may be greater than or equal to the second interval $W_{TP}$ between a side edge of the inorganic protective layer BFL exposed in the first opening OH-L and a side edge of the inorganic protective layer BFL exposed in the second opening OH-U. In an embodiment, the first interval $d_{TP}$ may be greater than the second interval $W_{TP}$, for example. When the notch portion NT allows the first interval $d_{TP}$ to be greater than or equal to the second interval $W_{TP}$, the deposition of the functional layer EL of a light-emitting element and the second electrode CE in the first opening OH-L may be facilitated.

The first interval $d_{TP}$ and the second interval $W_{TP}$ may have a ratio of 1:1 to 2:1. The first interval $d_{TP}$ may be 1.0 micrometer (μm) or less. In an embodiment, the first interval $d_{TP}$ may be 0.6 μm or less, for example. The notch portion NT portion having the height of the first interval $d_{TP}$ and the width of the second interval $W_{TP}$ may be determined by the height and width of a sacrificial layer SL (refer to FIG. 9A) provided in a method for manufacturing a display device of an embodiment to be described later.

In an embodiment, the pixel definition layer PDL may include a first portion PT1 directly disposed on the circuit layer DP-CL, a second portion PT2 spaced apart in a thickness direction in the circuit layer DP-CL and disposed on one side of the first portion PT1, and a third portion PT3 disposed between the first portion PT1 and the second portion PT2.

The first portion PT1 may include the inorganic protective layer BFL directly disposed on the circuit layer DP-CL and the organic layer OL disposed on the inorganic protective layer BFL, and may not be exposed by the opening OH.

The second portion PT2 may be a portion including a side surface of a pixel definition layer defining the second opening OH-U. That is, the second portion PT2 may include the inorganic protective layer BFL and the organic layer OL disposed on the inorganic protective layer BFL, and may define the upper opening OH-U exposing the inorganic protective layer BFL and the organic layer OL.

The third portion PT3 may be disposed between the first portion PT1 and the second portion PT2, and may define the first opening OH-L exposing the inorganic protective layer BFL. That is, the third portion PT3 may include the inorganic protective layer BFL and the organic layer OL disposed on the inorganic protective layer BFL, and may define the lower opening OH-L exposing the inorganic protective layer BFL.

In an embodiment, the notch portion NT defined on a lower side of the pixel definition layer PDL may be defined by the second portion PT2 and the third portion PT3. That is, the notch portion NT is defined as the inorganic protective layer BFL of the second portion PT2 and the third portion PT3, and the notch portion NT may be recessed in a direction toward the first portion PT1.

Referring to FIG. 3 and FIG. 4, in an embodiment, the functional layer EL of the light-emitting element ED-1 may include a first sub-functional layer EL-a and a second sub-functional layer EL-b. The first sub-functional layer EL-a may be a portion disposed in the first opening OH-L, and the second sub-functional layer EL-b may be a portion short-circuited without being connected in the first sub-functional layer EL-a and disposed in a portion other than the first opening OH-L. The second sub-functional layer EL-b may be disposed on a side surface of the pixel definition layer PDL defining the second opening OH-U and on an upper surface of the pixel definition layer PDL.

The first sub-functional layer EL-a may include the hole transport region HTR, the light-emitting layer EML, and the electron transport region ETR sequentially laminated. The second sub-functional layer EL-b may include the hole transport region HTR and the electron transport region ETR. In an embodiment, the second sub-functional layer EL-b may not include the light-emitting layer EML. However, the invention is not limited thereto, and the second sub-functional layer EL-b may include a portion of a light-emitting layer EML disconnected from the light-emitting layer EML of the first sub-functional layer EL-a.

When the functional layer EL is deposited by the pixel definition layer PDL having an undercut shape on a lower side thereof, there may be a portion in which the functional layer EL is not provided in a portion of the notch portion NT. Accordingly, there may be a short-circuited (or disconnected) portion between the first sub-functional layer EL-a and the second sub-functional layer EL-b. An edge portion ED-EL of the first sub-functional layer EL-a may contact the inorganic protective layer BFL exposed in the first opening OH-L, and the first sub-functional layer EL-a may be protected by the inorganic protective layer BFL.

In an embodiment, the second electrode CE of the light-emitting element ED-1 may include a first sub-electrode part CE-a and a second sub-electrode part CE-b. The first sub-electrode part CE-a may be a portion disposed in the first opening OH-L, and the second sub-electrode part CE-b may be a portion short-circuited without being connected in the first sub-electrode part CE-a and disposed in a portion other than the first opening OH-L. The second sub-electrode part CE-b may be disposed on a side surface of the pixel definition layer PDL defining the second opening OH-U and on an upper surface of the pixel definition layer PDL. The first sub-electrode part CE-a may be disposed on the first sub-functional layer EL-a, and the second sub-electrode part CE-b may be disposed on the second sub-functional layer EL-b.

When the second electrode CE is deposited by the pixel definition layer PDL having an undercut shape on a lower side thereof, there may be a portion in which the second electrode CE is not provided in a portion of the notch portion NT. Accordingly, there may be a short-circuited portion between the first sub-electrode part CE-a and the second sub-electrode part CE-b. An edge portion ED-CE of the first sub-electrode part CE-a may contact the inorganic protective layer BFL exposed by the first opening OH-L, and the edge portion ED-CE of the first sub-electrode part CE-a may be protected by the inorganic protective layer BFL.

In a portion in which the first sub-functional layer EL-a and the second sub-functional layer EL-b are disconnected, and the first sub-electrode part CE-a and the second sub-electrode part CE-b are short-circuited, the inorganic protective layer BFL may be exposed. The exposed inorganic protective layer BFL may be covered by the auxiliary electrode layer AED1 to be described later. In an embodiment, the auxiliary electrode layer AED1 may cover an entirety of components of a light-emitting element disposed in the first opening OH-L, and components of a light-emitting element and components of a pixel definition layer disposed in a region other than the first opening OH-L. The auxiliary electrode layer AED1 may be provided as a common layer to all of the light-emitting regions PXA-R, PXA-G, and PXA-B (refer to FIG. 1) and the non-light-emitting region NPXA (refer to FIG. 1.).

In an embodiment, in the first opening OH-L, an edge ED-AE of the first electrode AE, the edge ED-EL of the first sub-functional layer EL-a, and the edge ED-CE of the first sub-electrode part CE-a may overlap. In an embodiment, the edge ED-AE of the first electrode AE, the edge ED-EL of the first sub-functional layer EL-a, and the edge ED-CE of the first sub-electrode part CE-a may be identical, for example. The edge ED-AE of the first electrode AE, the edge ED-EL of the first sub-functional layer EL-a, and the edge ED-CE of the first sub-electrode part CE-a may contact the inorganic protective layer BFL exposed by the first opening OH-L.

Referring FIG. 2 and FIG. 3, the display device DD of an embodiment may include the encapsulation layer TFE disposed on the display element layer DP-ED. The encapsulation layer TFE may cover the light-emitting elements ED-1, ED-2, and ED-3, and the pixel definition layer PDL.

In an embodiment, the encapsulation layer TFE may protect the display element layer DP-ED from moisture and oxygen. In addition, the encapsulation layer TFE may protect the display element layer DP-ED from foreign substances such as dust particles.

In an embodiment, the encapsulation layer TFE may include the auxiliary electrode layer AED1, an encapsulation organic film MN, and an upper inorganic film IL2. In an embodiment, the auxiliary electrode layer AED1 may be disposed while covering the light-emitting elements ED-1, ED-2, and ED-3 and the pixel definition layer PDL, the upper inorganic film IL2 may be disposed on the auxiliary electrode layer AED1, and the encapsulation organic film MN may be disposed between the auxiliary electrode layer AED1 and the upper inorganic film IL2. That is, a space between the auxiliary electrode layer AED1 and the upper inorganic film IL2 may be filled with the encapsulation organic film MN.

The auxiliary electrode layer AED1 may cover the light-emitting elements ED-1, ED-2, and ED-3 disposed in the first opening OH-L, the inorganic protective layer BFL exposed by the first opening OH-L, and the organic layer OL disposed on the inorganic protective layer BFL.

The auxiliary electrode layer AED1 may include a transparent metal oxide. In an embodiment, the auxiliary electrode layer AED1 may include ITO, for example. The auxiliary electrode layer AED1 may be provided by atomic layer deposition. The auxiliary electrode layer AED1 may be formed by atomic layer deposition using an indium precursor.

In the disclosure, the auxiliary electrode layer AED1 is illustrated as being a single layer, but the invention is not limited thereto, and the auxiliary electrode layer AED1 may be provided as a plurality of layers. Each layer of the auxiliary electrode layer AED1 provided as a plurality of layers may be formed by atomic layer deposition.

In an embodiment, the auxiliary electrode layer AED1 may serve as a barrier layer which protects the light-emitting elements ED-1, ED-2, and ED-3 from moisture/oxygen or the like. In addition, the auxiliary electrode layer AED1 may be electrically connected to the second electrode CE.

Referring to FIG. 2 and FIG. 3, the auxiliary electrode layer AED1 covers an entirety of the light-emitting elements ED-1, ED-2, and ED-3 and the pixel definition layer PDL, and thus, may electrically connect the first sub-electrode part CE-a and the second sub-electrode part CE-b of the second electrode CE short-circuited with each other. That is, the auxiliary electrode layer AED1 may be provided to each of the first sub-electrode part CE-a and the second sub-electrode part CE-b and to the portion in which the first sub-electrode part CE-a and the second sub-electrode part CE-b are short-circuited to allow the first sub-electrode part CE-a and the second sub-electrode part CE-b to be electrically connected to each other. The auxiliary electrode layer AED1 may serve to reduce the resistance of the second electrode CE as well as to electrically connect the second electrode CE.

The auxiliary electrode layer AED1 may cover the inorganic protective layer BFL exposed in the first sub-electrode part CE-a, the second sub-electrode part CE-b, and the short-circuited portion. In addition, the auxiliary electrode layer AED1 may also overlap the first sub-functional layer EL-a and the second sub-functional layer EL-b, thereby effectively protecting components of a light-emitting element such as the first sub-functional layer EL-a and the second sub-functional layer EL-b.

In addition, in an embodiment, the auxiliary electrode layer AED1 may serve as a capping layer of the light-emitting elements ED-1, ED-2, and ED-3. The auxiliary electrode layer AED1 disposed on the second electrode CE has a refractive index of about 1.8 to about 1.9, and may increase the light extraction efficiency in the light-emitting elements ED-1, ED-2, and ED-3.

In the case of the display device DD of an embodiment, components of the functional layer EL and the second electrode CE of each of the light-emitting elements ED-1, ED-2, and ED-3 disposed respectively in correspondence to the light-emitting regions PXA-R, PXA-G, and PXA-B are disposed in the first opening OH-L of the pixel definition layer PDL having an undercut shape, and thus, may be protected by being completely covered by the inorganic protective layer BFL and the auxiliary electrode layer AED1. That is, the display device DD of an embodiment includes the auxiliary electrode layer AED1 covering an entirety of the pixel definition layer PDL having an undercut shape and the light-emitting elements ED-1, ED-2, and ED-3, and thus, may exhibit excellent reliability properties by effectively encapsulating the light-emitting elements.

In an embodiment, the auxiliary electrode layer AED1 is provided by atomic layer deposition, and accordingly, when compared to a case of being provided by a typical deposition method, the auxiliary electrode layer AED1 may be provided along the shape of the pixel definition layer PDL having an undercut portion. Accordingly, the auxiliary electrode layer AED1 covers and encapsulates an entirety of a light-emitting element, so that the display device of an embodiment may exhibit excellent reliability properties.

The encapsulation organic film may be formed by including an organic polymer material. In an embodiment, the encapsulation organic film MN may be formed from an acrylate-based resin, or the like, for example. The encapsulation organic film MN may include an acrylate-based polymer. The thickness of the encapsulation organic film MN may be relatively greater than the thickness of the neighboring auxiliary electrode layer AED1 and the upper inorganic film IL2.

In the encapsulation layer TFE, the upper inorganic film IL2 may include at least one of silicon nitride, silicon oxynitride, and silicon oxide. In addition, in an embodiment, the upper inorganic film IL2 may further include titanium oxide, aluminum oxide, or the like, but the invention is not limited thereto.

The display device DD of an embodiment described with reference to FIG. 2 to FIG. 4 includes the pixel definition layer PDL in which the first opening OH-L and the second opening OH-U, where the light-emitting elements ED-1, ED-2, and ED-3 disposed in the first opening OH-L are covered by the auxiliary electrode layer AED1, are defined, and thus, may exhibit excellent reliability properties. That is, the display device DD of an embodiment may exhibit excellent reliability properties since a portion of each of the light-emitting elements ED-1, ED-2, and ED-3 is disposed in the first opening OH-L, and thus, covered by the auxiliary electrode layer AED1, so that foreign matters which are introduced to a portion of the encapsulation layer TFE or encapsulation defect propagation due to the contraction or the like of the encapsulation layer TFE caused by the foreign matters are reduced.

Hereinafter, referring to FIGS. 5 to 7 or the like, a display device of an embodiment will be described. In the description of the display device of an embodiment illustrated in FIG. 5 to FIG. 7, the same contents as those described with reference to FIG. 1 to FIG. 4 will not be described again, and instead, differences will be mainly described.

Figure 5:
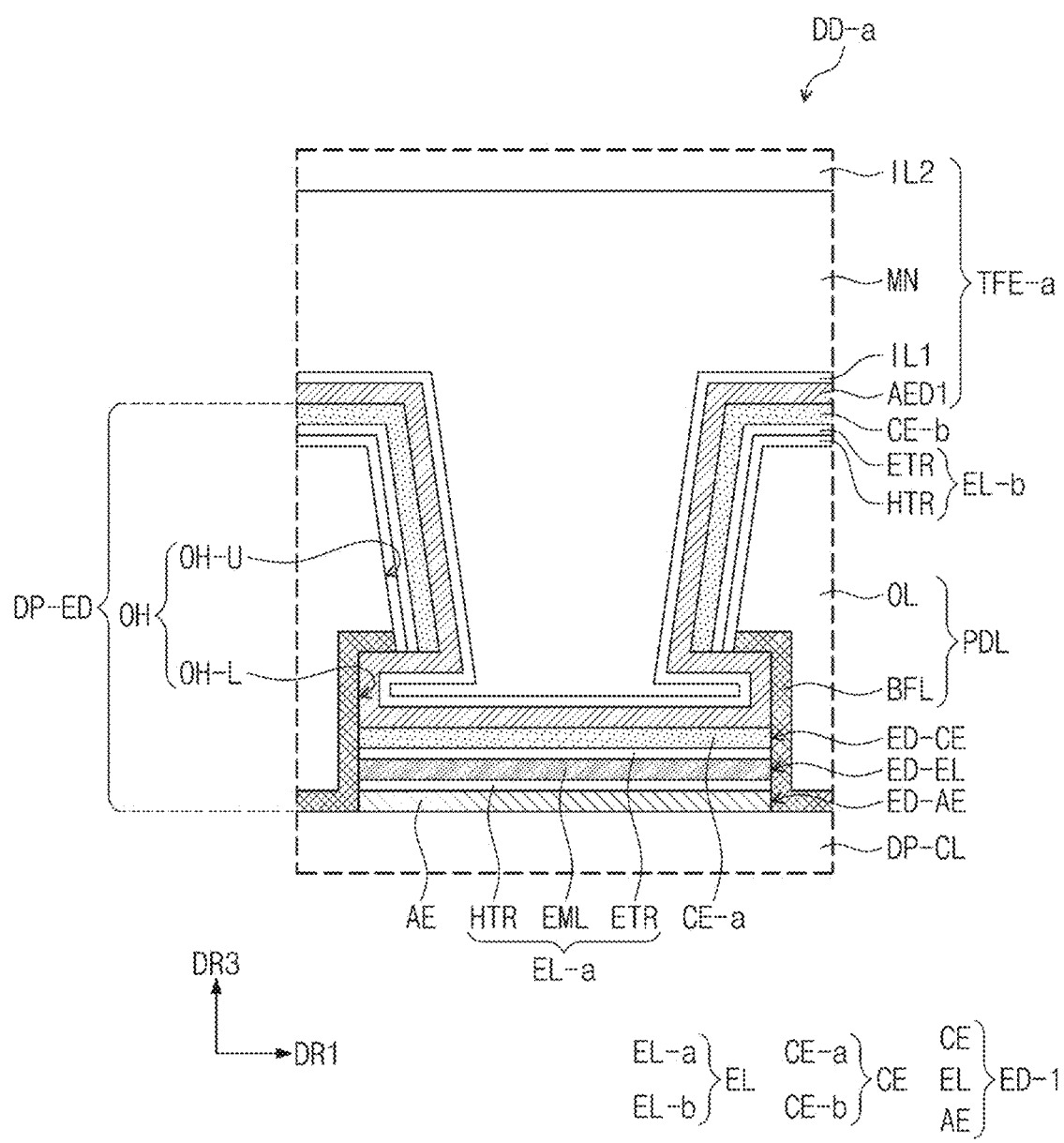
FIG. 5 is a cross-sectional view of an embodiment of a portion of a display device according to the invention.
Figure 6:
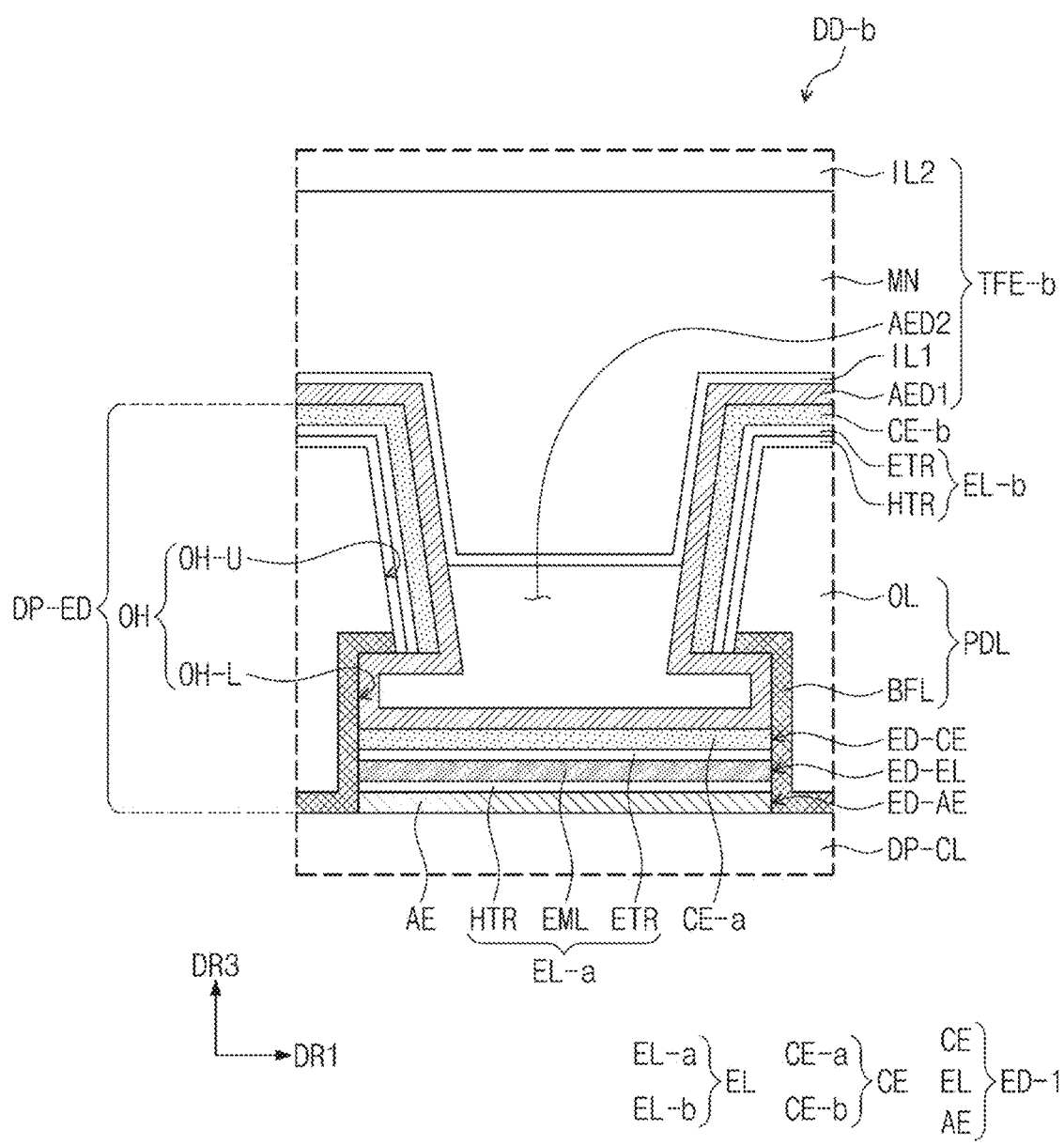
FIG. 6 is a cross-sectional view of an embodiment of a portion of a display device according to the invention.
Figure 7:
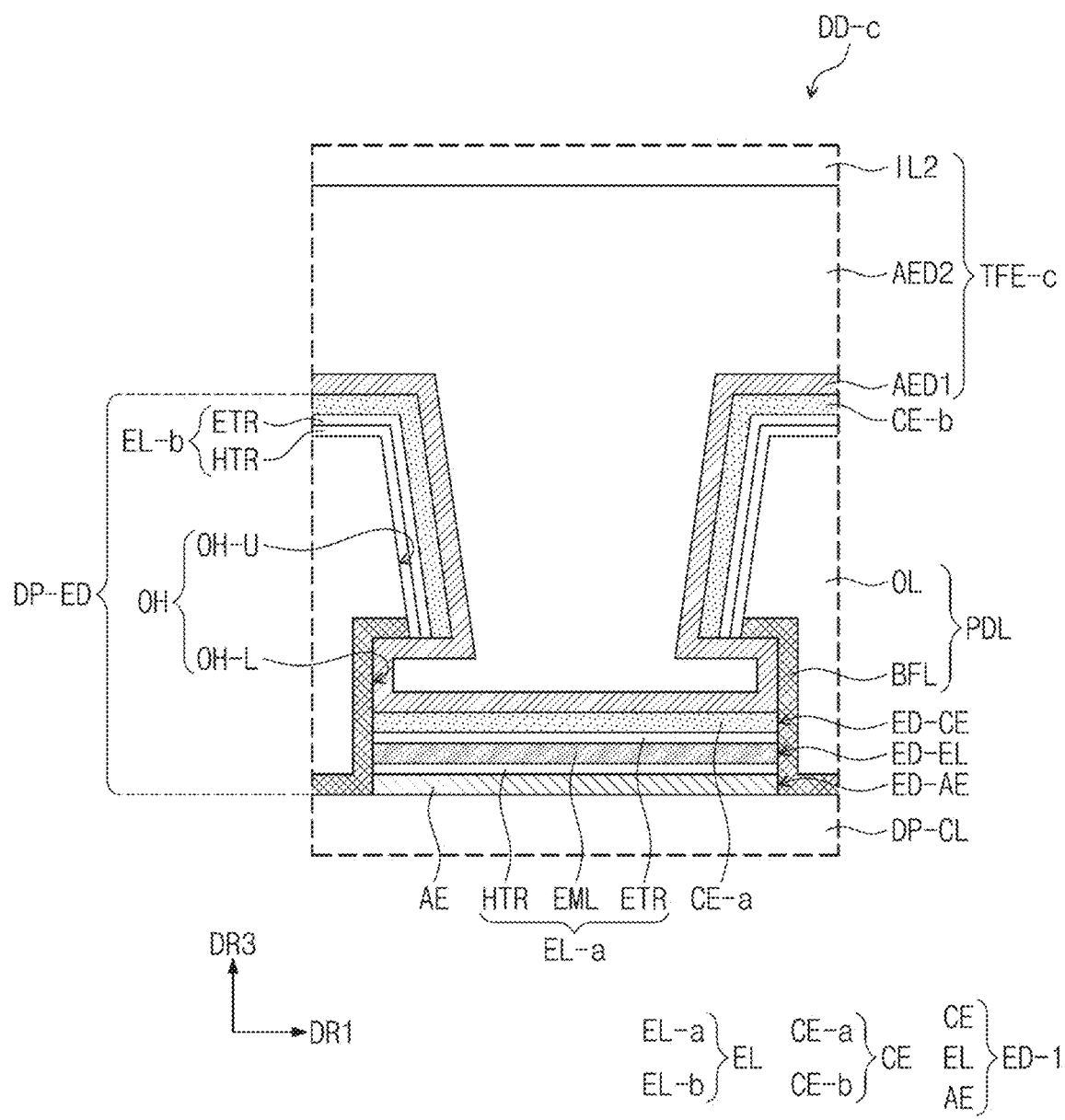
FIG. 7 is a cross-sectional view of an embodiment of a portion of a display device according to the invention.

Each of FIG. 5 to FIG. 7 is a cross-sectional view showing a portion of the display device according to the invention. Each of FIG. 5 and FIG. 7 illustrates a portion corresponding to region AA' of FIG. 2.

Referring FIG. 5, a display device DD-a of an embodiment may include a display element layer DP-ED and an encapsulation layer TFE-a disposed on the display element layer DP-ED. The encapsulation layer TFE-a may include an auxiliary electrode layer AED1, a lower inorganic film ILL an encapsulation organic film MN, and an upper inorganic film IL2. When compared to the encapsulation layer TFE in an embodiment illustrated in FIG. 3 or the like, there is a difference in that the encapsulation layer TFE-a in an embodiment further includes the lower inorganic film IL1.

The lower inorganic film IL1 may be disposed between the auxiliary electrode layer AED1 and the encapsulation organic film MN. The lower inorganic film IL1 may have a shape corresponding to the shape of the auxiliary electrode layer AED1. The lower inorganic film IL1 may cover the auxiliary electrode layer AED1.

The lower inorganic film IL1 may include at least one of silicon nitride, silicon oxynitride, and silicon oxide. In addition, in an embodiment, the lower inorganic film IL1 may further include titanium oxide, aluminum oxide, or the like, but the invention is not limited thereto.

In an embodiment, the encapsulation organic film MN may fill between the lower inorganic film IL1 and the upper inorganic film IL2. The encapsulation organic film MN may fill a portion of a first opening OH-L and a second opening OH-U.

Referring to FIG. 5, the lower inorganic film IL1 may cover the auxiliary electrode layer AED1 exposed in the first opening OH-L. The display device DD-a of an embodiment includes the auxiliary electrode layer AED1 and the lower inorganic film IL1 in the encapsulation layer TFE-a to cover an entirety of some of the components of a light-emitting element ED-1 (refer to FIG. 2) disposed in the first opening OH-L in particular, and thus, may exhibit excellent reliability properties by effectively protect the light-emitting element ED-1.

Referring FIG. 6, a display device DD-b of an embodiment may include a display element layer DP-ED and an encapsulation layer TFE-b disposed on the display element layer DP-ED. The encapsulation layer TFE-b may include an auxiliary electrode layer AED1, a filling electrode layer AED2, a lower inorganic film IL1 an encapsulation organic film MN, and an upper inorganic film IL2. When compared to the encapsulation layer TFE in an embodiment illustrated in FIG. 3 or the like, there is a difference in that the encapsulation layer TFE-b in an embodiment further includes the filling electrode layer AED2 and the lower inorganic film IL1.

The encapsulation layer TFE-b in an embodiment may include the filling electrode layer AED2 disposed between the auxiliary electrode layer AED1 and the encapsulation organic film MN. The filling electrode layer AED2 may include a conductive polymer material. In an embodiment, the filling electrode layer AED2 may include poly(3,4-ethylenedioxythiophene) polystyrene sulfonate (PEDOT:PSS), for example.

The filling electrode layer AED2 may be disposed on the auxiliary electrode layer AED1 to fill a first opening OH-L and a portion of a second opening OH-U. At this time, when compared to the encapsulation layer TFE in an embodiment illustrated in FIG. 3 or the like, the encapsulation organic film MN included in the encapsulation layer TFE-b may not be disposed in the first opening OH-L, but may be disposed in a portion of the second opening OH-U. That is, a portion of the second opening OH-U may be filled with the encapsulation organic film MN. The thickness of the filling electrode layer AED2 may be greater than the thickness of the auxiliary electrode layer AED1.

The filling electrode layer AED2 may be electrically connected to the auxiliary electrode layer AED1. The filling electrode layer AED2 may serve as an auxiliary electrode. In an embodiment, the filling electrode layer AED2 may serve to reduce the resistance of the second electrode CE by being electrically connected to the auxiliary electrode layer AED1, for example.

In addition, in an embodiment illustrated in FIG. 6, the encapsulation layer TFE-b may further include the lower inorganic film IL1. The lower inorganic film IL1 may be disposed between the filling electrode layer AED2 and the encapsulation organic film MN. The lower inorganic film IL1 may cover the filling electrode layer AED2 and the auxiliary electrode layer AED1.

In an embodiment, the lower inorganic film IL1 may include at least one of silicon nitride, silicon oxynitride, and silicon oxide. In addition, in an embodiment, the lower inorganic film IL1 may further include titanium oxide, aluminum oxide, or the like, but the invention is not limited thereto.

Referring FIG. 7, a display device DD-c of an embodiment may include a display element layer DP-ED and an encapsulation layer TFE-c disposed on the display element layer DP-ED. The encapsulation layer TFE-c may include an auxiliary electrode layer AED1, a filling electrode layer AED2, and an upper inorganic film IL2. When compared to the encapsulation layer TFE in an embodiment illustrated in FIG. 3 or the like, there is a difference in that the encapsulation organic film MN is replaced by the filling electrode layer AED2 in the encapsulation layer TFE-c.

That is, the encapsulation layer TFE-c in an embodiment illustrated in FIG. 7 may include the filling electrode layer AED2 including a conductive polymer as a component corresponding to an encapsulation organic film. The filling electrode layer may include PEDOT:PSS.

The filling electrode layer AED2 may fill a first opening OH-L and a second opening OH-U between the auxiliary electrode layer AED1 and the upper inorganic film IL2. The filling electrode layer AED2 may be electrically connected to the auxiliary electrode layer AED1. The filling electrode layer AED2 may serve as an auxiliary electrode. In an embodiment, the filling electrode layer AED2 may serve to reduce the resistance of the second electrode CE by being electrically connected to the auxiliary electrode layer AED1, for example.

The above-described display device in an embodiment illustrated in FIG. 5 to FIG. 7 includes a pixel definition layer having an undercut shape, and may effectively cover the components of a light-emitting element disposed in an undercut portion by an auxiliary electrode layer or the like. Accordingly, even when there is a defect in a portion of an encapsulation layer, the defective portion is not propagated to a neighboring light-emitting region, and a light-emitting element disposed in the undercut portion on a lower side of the pixel definition layer is protected by the auxiliary electrode layer or the like, so that the display device may exhibit improved reliability properties.

Hereinafter, referring to FIG. 8 to FIG. 10B or the like, a method for manufacturing a display device of an embodiment will be described. In the description of the manufacturing method of a display device of an embodiment to be described with reference to FIG. 8 to FIG. 10B or the like, the same contents as those described in the description of the display device of an embodiment with reference to FIG. 1 to FIG. 7 will not be described again, and instead, differences will be mainly described.

Figure 8:
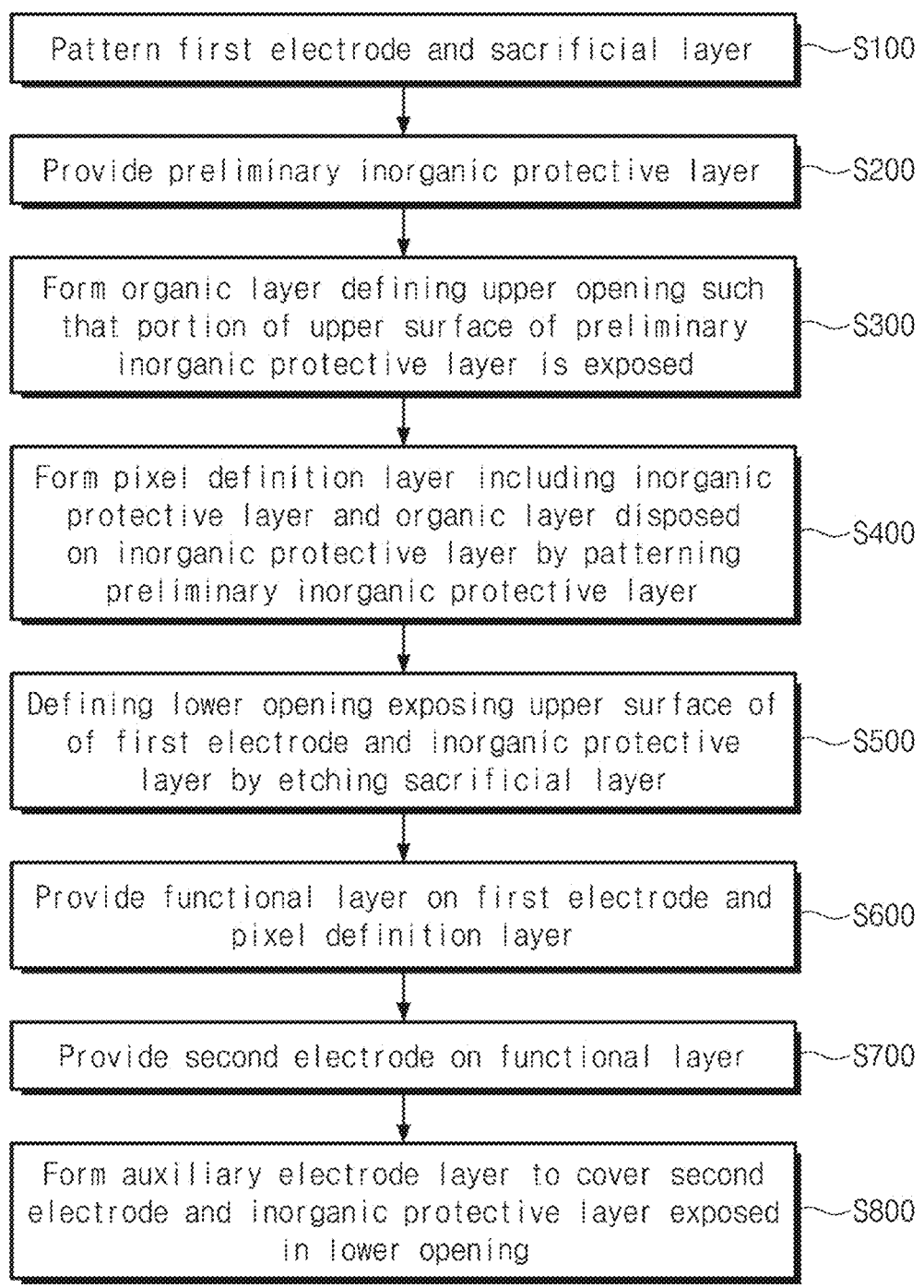
FIG. 8 is a flowchart showing operations of an embodiment of a method for manufacturing a display device according to the invention.

FIG. 8 is a flowchart showing operations of the method for manufacturing a display device according to the invention. Each of FIGS. 9A to 9H is a view schematically showing some of operations of the method for manufacturing a display device according to the invention. The operations of the manufacturing method of a display device in an embodiment illustrated in FIGS. 9A to 9H may be operations sequentially performed.

The method for manufacturing a display device of an embodiment may include patterning a first electrode and a sacrificial layer on a circuit layer (operation S100), providing a preliminary inorganic protective layer (operation S200), forming an organic layer in which an upper opening is defined such that a portion of an upper surface of the preliminary inorganic protective layer is exposed (operation S300), forming a pixel definition layer including an inorganic protective layer and the organic layer disposed on the inorganic protective layer by patterning the preliminary inorganic protective layer (operation S400), defining a lower opening exposing an upper surface of the first electrode and the inorganic protective layer by etching the sacrificial layer (operation S500), providing a functional layer on the first electrode and the pixel definition layer (operation S600), providing a second electrode on the functional layer (operation S700), and forming an auxiliary electrode layer to cover the second electrode and the inorganic protective layer exposed by the lower opening (operation S800).

Figure 9A:
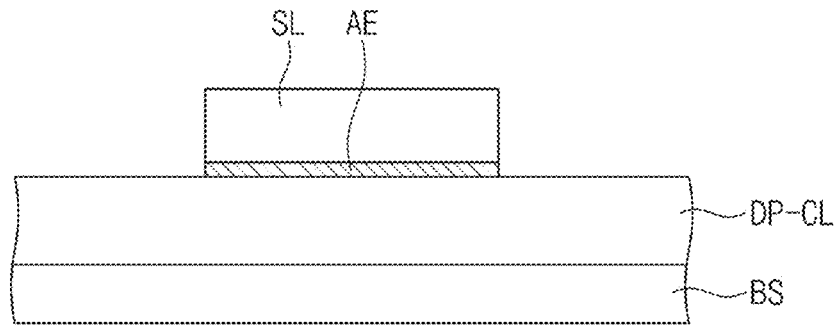
FIGS. 9A to 9H are views schematically showing an embodiment of some of operations of a method for manufacturing a display device according to the invention.

FIG. 9A is a view showing the patterning of a first electrode and a sacrificial layer (operation S100). Referring to FIG. 9A, a circuit layer DP-CL may be disposed on a base layer BS, and a first electrode AE and a sacrificial layer SL both patterned may be disposed on the circuit layer DP-CL. In an embodiment, the sacrificial layer SL may include at least one of IZO and indium gallium zinc oxide ("IGZO"), for example. In an embodiment, the first electrode AE and the sacrificial layer SL may be patterned in the same process, for example. However, the invention is not limited thereto, and the first electrode AE may be patterned and then the sacrificial layer SL may be patterned to correspond to the shape of the first electrode AE.

Figure 9B:
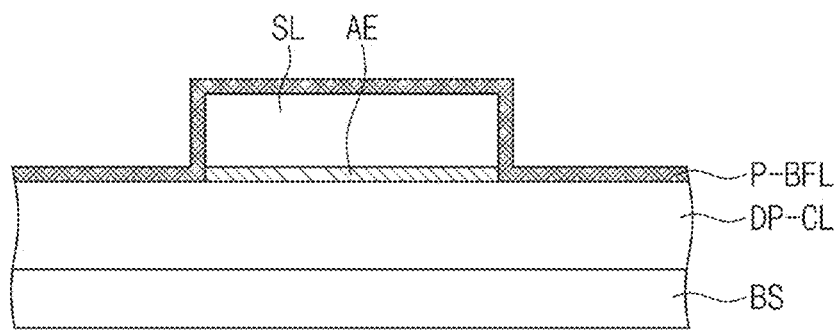

FIG. 9B is a view showing the providing of a preliminary inorganic protective layer (operation S200). Referring to FIG. 9B, a preliminary inorganic protective layer P-BFL may be disposed on the sacrificial layer SL. The preliminary inorganic protective layer P-BFL may entirely overlap the circuit layer DP-CL, and cover the patterned first electrode AE and the patterned sacrificial layer SL.

In an embodiment, the preliminary inorganic protective layer P-BFL may be provided by forming a film of silicon nitride, for example. The preliminary inorganic protective layer P-BFL may be formed by depositing silicon nitride. In addition, the preliminary inorganic protective layer P-BFL may be provided by atomic layer deposition. In an embodiment, the providing of a preliminary inorganic protective layer (operation S200) may include forming a preliminary inorganic protective layer including silicon nitride by atomic layer deposition, for example.

Figure 9C:
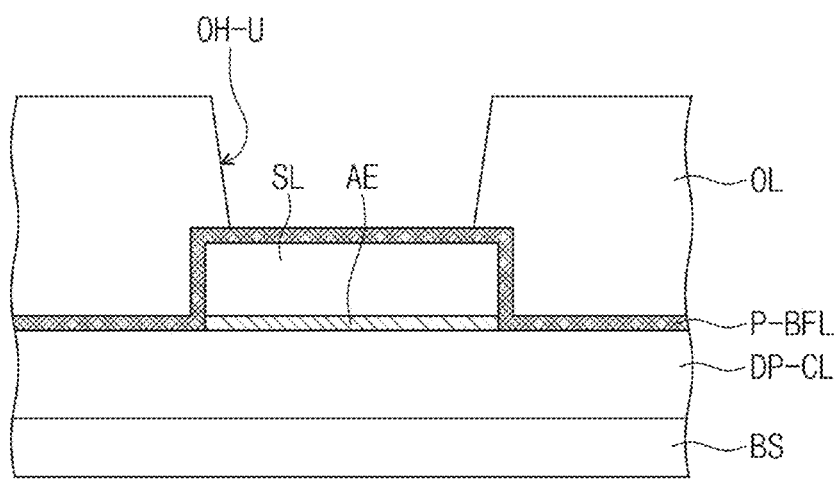

FIG. 9C is a view showing the forming of an organic layer in which an upper opening is defined to expose a portion of an upper surface of the preliminary inorganic protective layer (S300). Referring to FIG. 9C, an organic layer OL may be provided on the preliminary inorganic protective layer P-BFL. The organic layer OL may be patterned to define an upper opening OH-U. The organic layer OL may include a polymer resin. In the upper opening OH-U defined in the organic layer OL, a portion of an upper surface of the preliminary inorganic protective layer P-BFL may be exposed. In addition, the preliminary inorganic protective layer P-BFL not exposed by the upper opening OH-U may be disposed on a lower side of the organic layer OL. Edges of the first electrode AE and the sacrificial layer SL may overlap the organic layer OL.

Figure 9D:
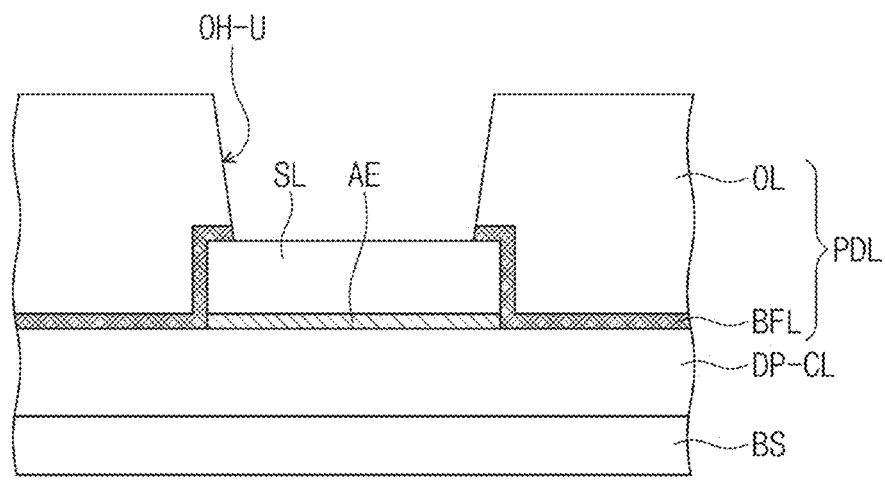

FIG. 9D is a view showing the forming of a pixel definition layer including an inorganic protective layer and the organic layer disposed on the inorganic protective layer by patterning the preliminary inorganic protective layer (operation S400). Referring to FIG. 9D, an inorganic protective layer BFL is formed by patterning the preliminary inorganic protective layer, and after the preliminary inorganic protective layer P-BFL (refer to FIG. 9C) is removed, an upper surface of the sacrificial layer SL may be exposed in the upper opening OH-U. A pixel definition layer PDL may include the inorganic protective layer BFL and the organic layer OL disposed on the inorganic protective layer BFL.

Figure 9E:
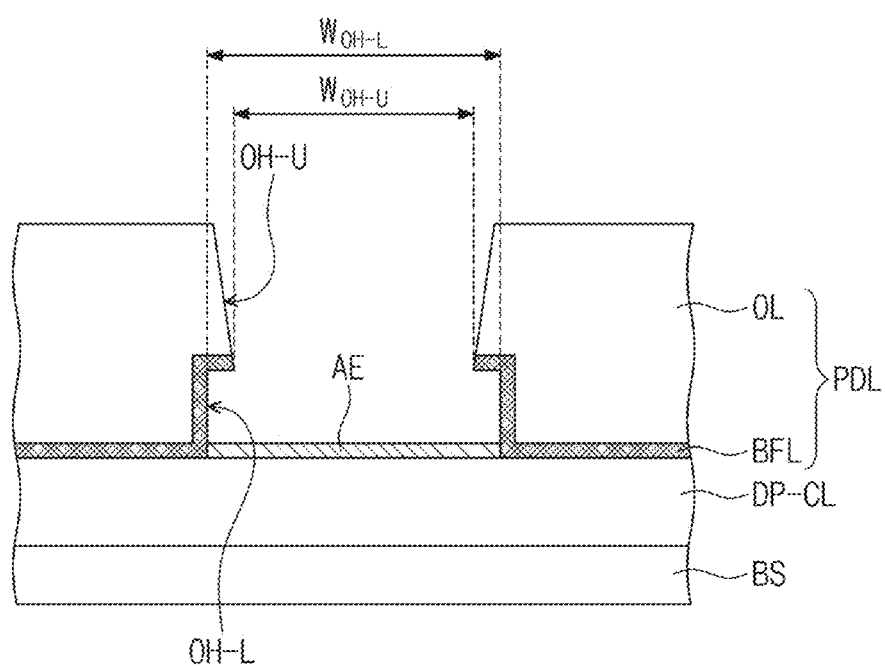

FIG. 9E is a view showing the forming of a lower opening exposing an upper surface of the first electrode and the inorganic protective layer by etching the sacrificial layer (operation S500). Referring to FIG. 9E, the sacrificial layer SL exposed in the forming of a pixel definition layer (operation S400) illustrated in FIG. 9D is etched and removed, and a lower opening OH-L may be defined in a portion in which the sacrificial layer SL used to be disposed. The lower opening OH-L may be defined by the inorganic protective layer BFL and the first electrode AE. In the lower opening OH-L, a portion of the inorganic protective layer BFL of the pixel definition layer PDL may be exposed, and an upper surface of the first electrode AE may be exposed.

A width $W_{OH-L}$ of the lower opening OH-L defined as an interval between exposed inorganic protective layers BFL may be greater than a width $W_{OH-U}$ of the upper opening OH-U defined as an interval between the exposed inorganic protective layers BFL. That is, by the defining of a lower opening (operation S500), a lower portion of the pixel definition layer PDL may have an undercut shape.

Figure 9F:
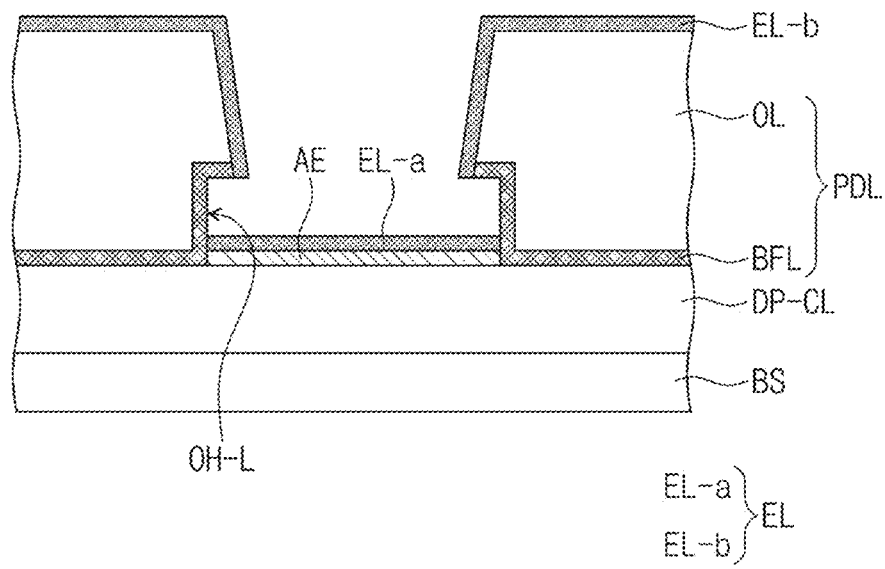

FIG. 9F is a view showing the providing of a functional layer on the first electrode and the pixel definition layer (operation S600). In the providing of a functional layer (operation S600) illustrated in FIG. 9F, the hole transport region HTR (refer to FIG. 3), the light-emitting layer EML (refer to FIG. 3), and the electron transport region ETR (refer to FIG. 3) may be sequentially provided.

A functional layer EL provided in the providing of a functional layer (operation S600) may include a first sub-functional layer EL-a and a second sub-functional layer EL-b. The first sub-functional layer EL-a and the second sub-functional layer EL-b may be disconnected from each other. There may be a portion in which the functional layer EL is not disposed in the lower opening OH-L. In the portion in which the functional layer EL is not disposed, the inorganic protective layer BFL may be exposed. The first sub-functional layer EL-a may be disposed on the first electrode AE in the lower opening OH-L, and the second sub-functional layer EL-b may be disposed spaced apart from the first sub-functional layer EL-a and covering a side surface and an upper surface of the pixel definition layer PDL. The first sub-functional layer EL-a may include a hole transport region, a light-emitting layer, and an electron transport region, and the second sub-functional layer EL-b may include the hole transport region and the electron transport region. The second sub-functional layer EL-b may not include a light-emitting layer, or may include a light-emitting layer only in a portion adjacent to the first sub-functional layer EL-a.

Figure 9G:
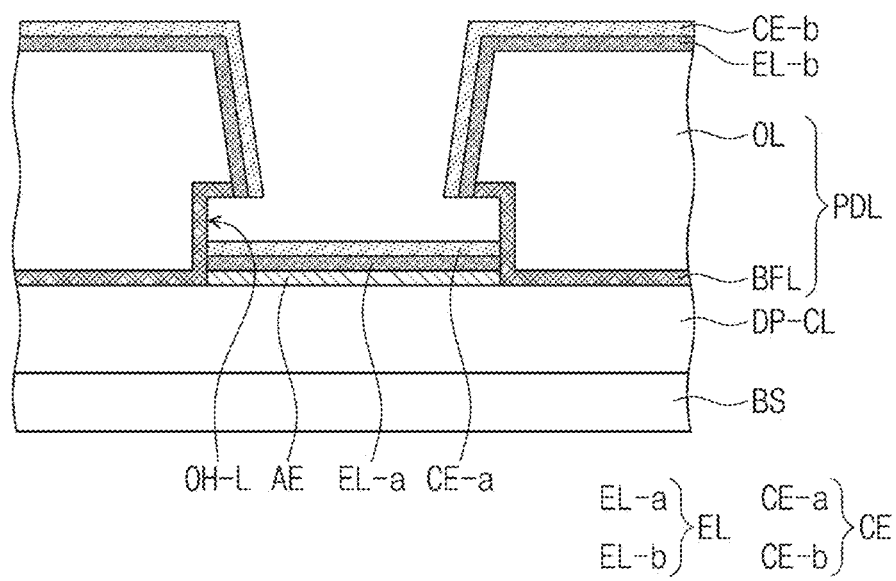

FIG. 9G is a view showing the providing of a second electrode on the functional layer (operation S700). A second electrode CE provided in the providing of a second electrode (operation S700) illustrated in FIG. 9G may include a first sub-electrode part CE-a and a second sub-electrode part CE-b. The first sub-electrode part CE-a may be disposed on the first sub-functional layer EL-a, and the second sub-electrode part CE-b may be disposed on the second sub-functional layer EL-b.

The first sub-electrode part CE-a and the second sub-electrode part CE-b may be short-circuited with each other. There may be a portion in which the second electrode CE is not disposed in the lower opening OH-L. In the portion in which the second electrode CE is not disposed, the inorganic protective layer BFL may be exposed. The first sub-electrode part CE-a may be disposed overlapping the second electrode CE in the lower opening OH-L, and the second sub-electrode part CE-b may be disposed spaced apart from the first sub-electrode part CE-a and overlapping the side surface and the upper surface of the pixel definition layer PDL.

The providing of a functional layer (operation S600) and the providing of a second electrode (operation S700) illustrated in FIG. 9F and FIG. 9G may respectively include forming the functional layer and the second electrode by a deposition method.

Figure 10A:
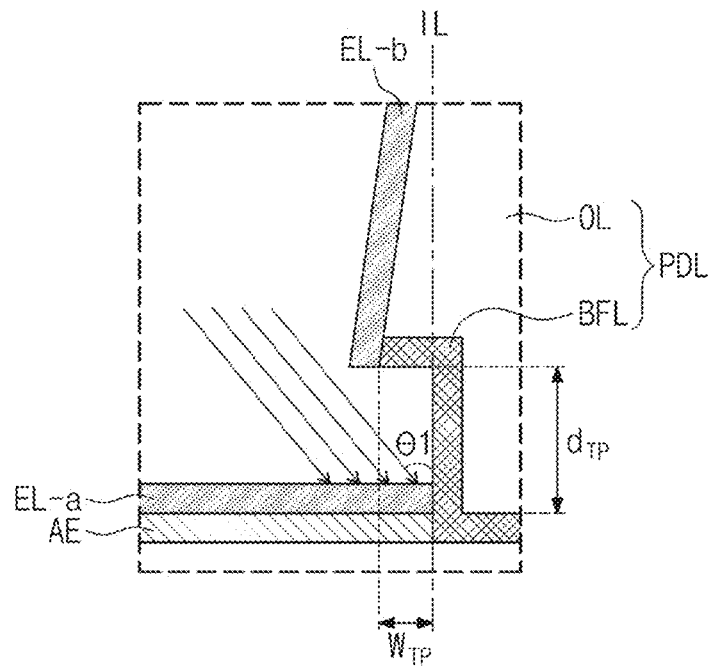
FIG. 10A is a view showing an embodiment of some of operations of manufacturing a display device according to the invention.

FIG. 10A shows providing of a functional layer by a deposition method. When providing the functional layer, the deposition angle $\theta 1$ may be about 60° or less. When providing the functional layer, the deposition angle $\theta 1$ may be defined as the incident angle of a deposition material with respect to a reference line IL. In an embodiment, when providing a functional layer in an embodiment, the deposition angle $\theta 1$ may be about 50°. When a first interval $d_{TP}$ in a portion in which a functional layer material is provided is greater than or equal to a second interval $W_{TP}$ which is the width of a protruding portion of a pixel definition layer, when the deposition angle $\theta 1$ is set to about 50° when providing a functional layer, the first sub-functional layer EL-a may be sufficiently deposited in the lower opening OH-L to overlap the first electrode AE.

Figure 10B:
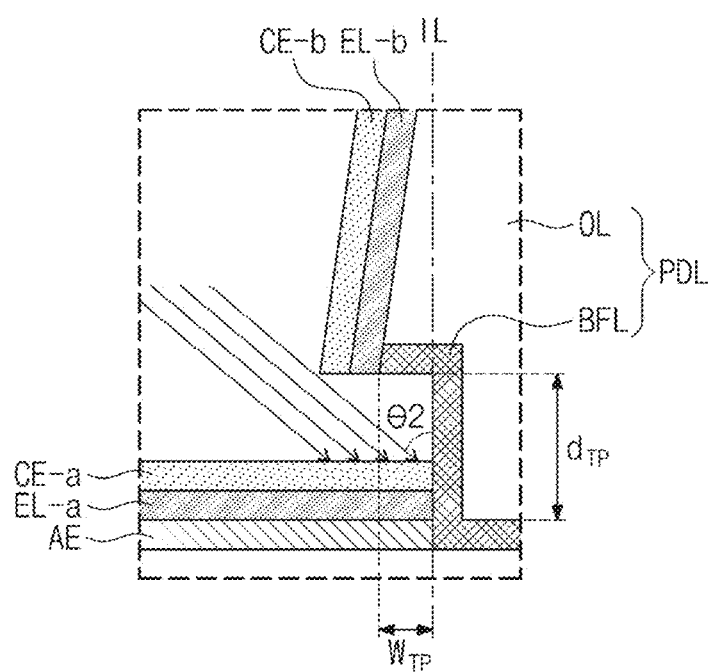
FIG. 10B is a view showing an embodiment of some of operations of manufacturing a display device according to the invention.

FIG. 10B shows the providing of a second electrode by a deposition method. When providing the second electrode, the deposition angle $\theta 2$ may be about 60° or less. When providing the second electrode, the deposition angle $\theta 2$ may be defined as the incident angle of a deposition material with respect to the reference line IL. In an embodiment, when providing a second electrode layer in an embodiment, the deposition angle $\theta 2$ may be about 50°, for example. When providing a second electrode layer in an embodiment, the deposition angle $\theta 2$ may be greater than the deposition angle $\theta 1$ when providing a functional layer.

When a first interval $d_{TP}$ in a portion in which a second electrode is provided is greater than or equal to the second interval $W_{TP}$ which is the width of a protruding portion of a pixel definition layer, when the deposition angle $\theta 2$ is set to about 50° when providing a second electrode, the first sub-electrode part CE-a may be sufficiently deposited in the lower opening OH-L to overlap the first sub-functional layer EL-a.

Figure 9H:
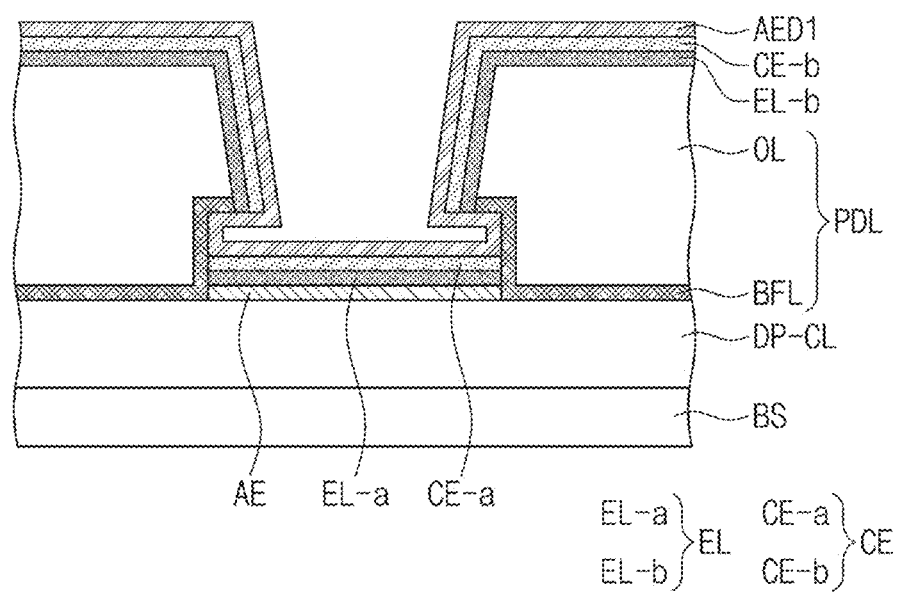

FIG. 9H illustrates the forming of an auxiliary electrode layer to cover the second electrode and the inorganic protective layer exposed by the lower opening (operation S800). The auxiliary electrode layer AED1 may cover the inorganic protective layer BFL exposed by the lower opening since the first sub-electrode part CE-a, the second sub-electrode part CE-b, and the second electrode CE are not disposed.

The forming of an auxiliary electrode layer may include forming an auxiliary electrode layer including a transparent metal oxide by atomic layer deposition. The auxiliary electrode layer AED1 may be formed by atomic layer deposition using an indium precursor. The auxiliary electrode layer AED1 may include ITO. The auxiliary electrode layer AED1 may be provided as a single layer or a plurality of layers.

The manufacturing method of a display device of an embodiment may further include additionally forming other layers of an encapsulation layer after the manufacturing operations described with reference to FIG. 9A to FIG. 9H. In an embodiment, in the case of a method for manufacturing a display device having the configuration of the encapsulation layer TFE in FIG. 3, after the forming of an auxiliary electrode layer to cover the second electrode and the inorganic protective layer exposed by the lower opening (operation S800), forming of the encapsulation organic film MN (refer to FIG. 3) and forming of the upper inorganic film IL2 (refer to FIG. 3) may be further included, for example.

In addition, in the case of a method for manufacturing a display device of an embodiment having the configuration of the encapsulation layer TFE-a in the embodiment illustrated in FIG. 5, after the forming of an auxiliary electrode layer (operation S800), forming of the lower inorganic film IL1 (refer to FIG. 5), forming of the encapsulation organic film MN (refer to FIG. 5), and forming of the upper inorganic film IL2 (refer to FIG. 5), which are sequentially performed, may be further included.

In the case of a method for manufacturing a display device of an embodiment having the configuration of the encapsulation layer TFE-b in the embodiment illustrated in FIG. 6, after the forming of an auxiliary electrode layer (operation S800), forming of the filling electrode layer AED2, (refer to FIG. 6), forming of the lower inorganic film IL1 (refer to FIG. 6), forming of the encapsulation organic film MN (refer to FIG. 6), and forming of the upper inorganic film IL2 (refer to FIG. 6), which are sequentially performed, may be further included.

In the case of a method for manufacturing a display device of an embodiment having the configuration of the encapsulation layer TFE-c in accordance with the embodiment illustrated in FIG. 7, after the forming of an auxiliary electrode layer (operation S800), instead of an encapsulation organic film, forming of the filling electrode layer AED2 (refer to FIG. 7) including a conductive polymer, and forming of the upper inorganic film IL2 (refer to FIG. 7) on the filling electrode layer may be further included.

A display device of an embodiment includes a pixel definition layer having an undercut shape, and effectively covers components of a light-emitting element disposed in an undercut portion by an auxiliary electrode layer or the like, and thus, may exhibit excellent reliability properties. That is, the display device of an embodiment may exhibit improved reliability by encapsulating components of a light-emitting element disposed in an opening with an auxiliary electrode layer, the light-emitting element disconnected from neighboring light-emitting elements by the pixel definition layer having an undercut shape, to prevent a defect in an encapsulation layer from being propagated to a neighboring light-emitting region.

In addition, the manufacturing method of a display device of an embodiment may manufacture a display device having excellent reliability by including forming an auxiliary electrode layer to sufficiently cover the components of a light-emitting element disposed in the undercut portion, thereby effectively encapsulating each of light-emitting elements disposed respectively corresponding to light-emitting regions.

A display device of an embodiment includes an auxiliary electrode layer as an encapsulation layer, thereby sufficiently covering a light-emitting layer or the like of a light-emitting element in an opening to exhibit improved reliability.

A method for manufacturing a display device includes a method for forming an auxiliary electrode layer which covers a light-emitting element portion disposed in a lower opening, and thus, may be used in the manufacturing of a display device having excellent reliability properties.

Although the invention has been described with reference to preferred embodiments of the invention, it will be understood by those skilled in the art that various modifications and changes in form and details may be made therein without departing from the spirit and scope of the invention as set forth in the following claims.

Accordingly, the technical scope of the invention is not intended to be limited to the contents set forth in the detailed description of the specification, but is intended to be defined by the appended claims.

What is claimed is:
1. A display device comprising:
a base layer;
a circuit layer disposed on the base layer;
a pixel definition layer which is disposed on the circuit layer and includes an inorganic protective layer and an organic layer disposed on the inorganic protective layer, and in which a first opening adjacent to the circuit layer and exposing the inorganic protective layer and a second opening exposing the organic layer on the first opening are defined;
a light-emitting element including a first electrode disposed on the circuit layer, a functional layer disposed on the first electrode, and a second electrode disposed on the functional layer; and
an encapsulation layer disposed on the light-emitting element, the encapsulation layer including:
an auxiliary electrode layer which covers the light-emitting element disposed in the first opening, the inorganic protective layer exposed by the first opening, and the organic layer disposed on the inorganic protective layer;
an encapsulation organic film disposed on the auxiliary electrode layer; and
an upper inorganic film disposed on the encapsulation organic film.
2. The display device of claim 1, wherein the auxiliary electrode layer comprises a transparent metal oxide.
3. The display device of claim 1, wherein the auxiliary electrode layer is formed by atomic layer deposition using an indium precursor.
4. The display device of claim 1, wherein in a cross-section perpendicular to the base layer, a width of the first opening is greater than a width of the second opening adjacent to the first opening.
5. The display device of claim 4, wherein:
the functional layer comprises:
a first sub-functional layer disposed on the first electrode and disposed in the first opening; and
a second sub-functional layer disconnected from the first sub-functional layer and disposed on a side surface of the pixel definition layer defining the second opening and on an upper surface of the pixel definition layer, and
the second electrode comprises:
a first sub-electrode part disposed on the first sub-functional layer; and a second sub-electrode part short-circuited with the first sub-electrode part and disposed on the second sub-functional layer.
6. The display device of claim 5, wherein the auxiliary electrode layer is disposed on the first sub-electrode part and the second sub-electrode part, and electrically connects the first sub-electrode part and the second sub-electrode part.
7. The display device of claim 5, wherein:
the inorganic protective layer is exposed in a short-circuited portion in which the first sub-functional layer and the second sub-functional layer are disconnected and the first sub-electrode part and the second sub-electrode part are short-circuited; and
the auxiliary electrode layer covers the first sub-electrode part, the second sub-electrode part, and the inorganic protective layer exposed in the short-circuited portion.
8. The display device of claim 7, wherein the encapsulation layer further comprises a lower inorganic film disposed between the auxiliary electrode layer and the encapsulation organic film and including at least one of silicon nitride, silicon oxynitride, and silicon oxide.
9. The display device of claim 8, wherein the lower inorganic film covers the auxiliary electrode layer.
10. The display device of claim 7, wherein:
the encapsulation layer further comprises a filling electrode layer disposed between the auxiliary electrode layer and the encapsulation organic film, and the filling electrode layer includes a conductive polymer; and
a lower inorganic film disposed between the filling electrode layer and the encapsulation organic film, and the lower inorganic film includes at least one of silicon nitride, silicon oxynitride, and silicon oxide.
11. The display device of claim 10, wherein the filling electrode layer comprises PEDOT: PSS.
12. The display device of claim 10, wherein the filling electrode layer fills the first opening and a portion of the second opening.
13. The display device of claim 5, wherein:
the first sub-functional layer comprises a hole transport region, a light-emitting layer, and an electron transport region sequentially laminated; and
the second sub-functional layer comprises the hole transport region and the electron transport region, and does not comprise the light-emitting layer.
14. The display device of claim 5, wherein in the first opening, an edge of the first electrode, an edge of the first sub-functional layer, and an edge of the first sub-electrode part overlap.
15. The display device of claim 14, wherein the edge of the first electrode, the edge of the first sub-functional layer, and the edge of the first sub-electrode part contact the inorganic protective layer exposed in the first opening.
16. The display device of claim 1, wherein the inorganic protective layer comprises silicon nitride.
17. The display device of claim 1, wherein the upper inorganic film comprises at least one of silicon nitride, silicon oxynitride, and silicon oxide.
18. The display device of claim 1, wherein:
the encapsulation organic film comprises an acrylic polymer; and the encapsulation organic film fills the first opening and the second opening between the auxiliary electrode layer and the upper inorganic film.

19. The display device of claim 1, wherein the encapsulation organic film is a filling electrode layer including a conductive polymer, and is electrically connected to the auxiliary electrode layer.

20. The display device of claim 19, wherein the filling electrode layer fills the first opening and the second opening between the auxiliary electrode layer and the upper inorganic film.

21. The display device of claim 1, wherein in a cross-section perpendicular to the base layer, a first interval from an upper surface of the first electrode exposed in the first opening to a lower surface of the inorganic protective layer is greater than or equal to a second interval between a side edge of the inorganic protective layer exposed in the first opening and a side edge of the inorganic protective layer exposed in the second opening.

22. The display device of claim 21, wherein a ratio of the first interval to the second interval is 1:1 to 2:1.

23. A display device comprising:
a base layer;
a circuit layer disposed on the base layer;
a pixel definition layer which is disposed on the circuit layer and includes an inorganic protective layer and an organic layer disposed on the inorganic protective layer, and in which an opening is defined, the pixel definition layer comprising:
  a first portion directly disposed on the circuit layer;
  a second portion which is spaced apart in a thickness direction in the circuit layer and disposed on one side of the first portion, and in which an upper opening exposing the inorganic protective layer and the organic layer; and
a third portion disposed between the first portion and the second portion, and having a lower opening exposing the inorganic protective layer;
a light-emitting element including a first electrode disposed on the circuit layer, a functional layer disposed on the first electrode, and a second electrode disposed on the functional layer; and
an encapsulation layer disposed on the light-emitting element, the encapsulation layer comprising:
  an auxiliary electrode layer which covers the light-emitting element disposed in the lower opening, the inorganic protective layer exposed in the lower opening, and the light-emitting element disposed in the upper opening;
  an encapsulation organic film disposed on the auxiliary electrode layer; and
  an upper inorganic film disposed on the encapsulation organic film.

24. The display device of claim 23, wherein the pixel definition layer is defined by the second portion and the third portion, and includes a notch portion recessed in the first portion direction.

25. The display device of claim 24, wherein:
the functional layer comprises:
  a first sub-functional layer disposed in the lower opening; and
  a second sub-functional layer disconnected from the first sub-functional layer and disposed on a side surface of the pixel definition layer defining the upper opening and on an upper surface of the pixel definition layer; and
the second electrode comprises:
  a first sub-electrode part disposed on the first sub-functional layer; and
  a second sub-electrode part short-circuited with the first sub-electrode part and disposed on the second sub-functional layer.

26. The display device of claim 25, wherein an edge of the first electrode, an edge of the first sub-functional layer, and an edge of the first sub-electrode part are disposed in the notch portion.

27. The display device of claim 25, wherein:
the inorganic protective layer is exposed in a short-circuited portion in which the first sub-functional layer and the second sub-functional layer are disconnected and the first sub-electrode part and the second sub-electrode part are short-circuited; and
the auxiliary electrode layer covers the first sub-electrode part, the second sub-electrode part, and the inorganic protective layer exposed in the short-circuited portion.

28. A display device comprising:
a base layer;
a circuit layer disposed on the base layer;
a pixel definition layer which is disposed on the circuit layer and includes an inorganic protective layer and an organic layer disposed on the inorganic protective layer, and in which a first opening adjacent to the circuit layer and exposing the inorganic protective layer and a second opening exposing the organic layer on the first opening are defined;
a light-emitting element including a first electrode disposed on the circuit layer, a functional layer disposed on the first electrode, and a second electrode disposed on the functional layer; and
an encapsulation layer disposed on the light-emitting element, the encapsulation layer including:
  an auxiliary electrode layer which covers the light-emitting element disposed in the first opening, the inorganic protective layer exposed by the first opening, and the organic layer disposed on the inorganic protective layer;
  a lower inorganic film disposed on the auxiliary electrode layer;
  an encapsulation organic film disposed on the lower inorganic film; and
  an upper inorganic film disposed on the encapsulation organic film,
wherein a total surface area of the lower inorganic film and a total surface area of the upper inorganic film are different.

29. The display device of claim 28, wherein the total surface area of the lower inorganic film is greater than the total surface area of the upper inorganic film.

30. The display device of claim 28, wherein a notch portion is defined concavely into the pixel definition layer adjacent to the circuit layer, and wherein the lower inorganic film is disposed following the shape of the notch portion.

31. The display device of claim 30, wherein the upper inorganic film is a planarization layer.

32. The display device of claim 28, wherein the display device includes a plurality of light emitting regions that emit light in different wavelength ranges and are separated by the pixel definition layer, and
wherein in each of the light emitting regions, the total surface area of the lower inorganic film is different from the total surface area of the upper inorganic film.

33. The display device of claim 32, wherein in each of the light emitting regions, the total surface area of lower inorganic film is larger than the total surface area of upper inorganic film.

34. The display device of claim 28, wherein in a cross-section perpendicular to the base layer, a width of the first opening is greater than a width of the second opening adjacent to the first opening.

35. The display device of claim 34, wherein:
the functional layer comprises:
- a first sub-functional layer disposed on the first electrode and disposed in the first opening; and
- a second sub-functional layer disconnected from the first sub-functional layer and disposed on a side surface of the pixel definition layer defining the second opening and on an upper surface of the pixel definition layer, and the second electrode comprises:
- a first sub-electrode part disposed on the first sub-functional layer; and a second sub-electrode part short-circuited with the first sub-electrode part and disposed on the second sub-functional layer.

* * * * *